United States Patent
Aoki et al.

(10) Patent No.: US 8,032,101 B2
(45) Date of Patent: Oct. 4, 2011

(54) ELECTRONIC APPARATUS, DISPERSION ADJUSTMENT METHOD OF IC INTERNAL COMPONENT SECTION OF ELECTRONIC APPARATUS AND IC

(75) Inventors: Hiroshi Aoki, Kanagawa (JP); Tatsuo Shinbashi, Tokyo (JP)

(73) Assignee: Sony Corporation, Tokyo (JP)

( * ) Notice: Subject to any disclaimer, the term of this patent is extended or adjusted under 35 U.S.C. 154(b) by 410 days.

(21) Appl. No.: 12/391,619

(22) Filed: Feb. 24, 2009

(65) Prior Publication Data

US 2009/0244397 A1 Oct. 1, 2009

(30) Foreign Application Priority Data

Mar. 31, 2008 (JP) ................. 2008-093575

(51) Int. Cl.
*H04B 1/18* (2006.01)
*H04B 1/16* (2006.01)
(52) U.S. Cl. ...................... 455/280; 455/334
(58) Field of Classification Search .................. 455/280, 455/333, 334
See application file for complete search history.

(56) References Cited

U.S. PATENT DOCUMENTS 7,016,661 B2 * 3/2006 Gorday et al. ................ 455/309
7,822,403 B2 * 10/2010 Tamura ........................ 455/334

FOREIGN PATENT DOCUMENTS

JP 11-168399 6/1999

* cited by examiner

*Primary Examiner* — Hai L Nguyen
(74) *Attorney, Agent, or Firm* — Oblon, Spivak, McClelland, Maier & Neustadt, L.L.P.

(57) ABSTRACT

An electronic apparatus includes: a first integrated circuit including an internal component section capable of being adjusted with adjustment data, a nonvolatile memory in which beforehand acquired adjustment data of a result of adjustment carried out in advance for the internal component section are stored, and an interface section having a data transfer function of transferring the beforehand acquired adjustment data read out from the nonvolatile memory to the outside and a data storage function of storing actual use adjustment data sent from the outside and supplying the stored actual use adjustment data to the internal component section; and a second integrated circuit including a signal processor, to which the interface section of the first integrated circuit is connected.

7 Claims, 17 Drawing Sheets

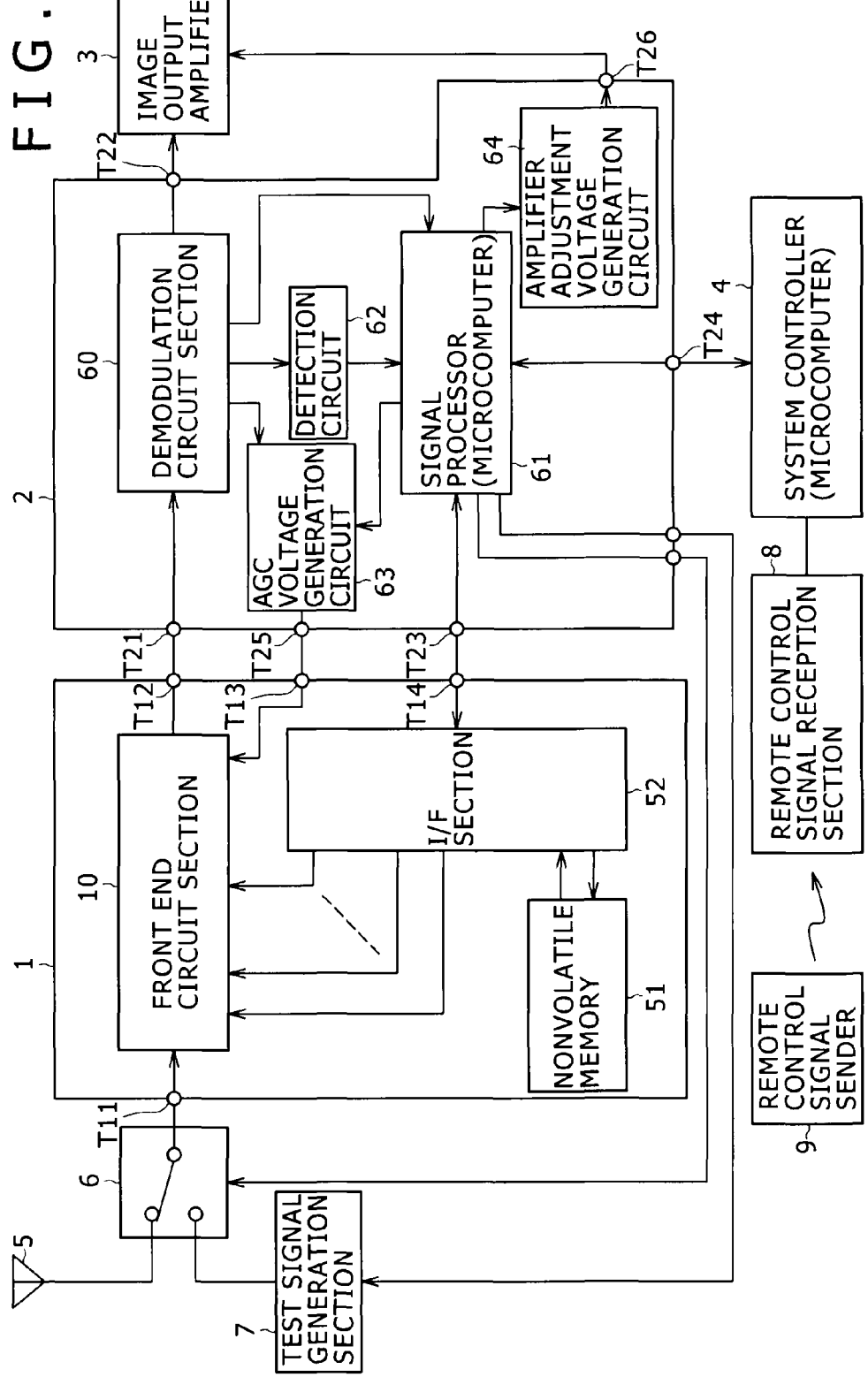

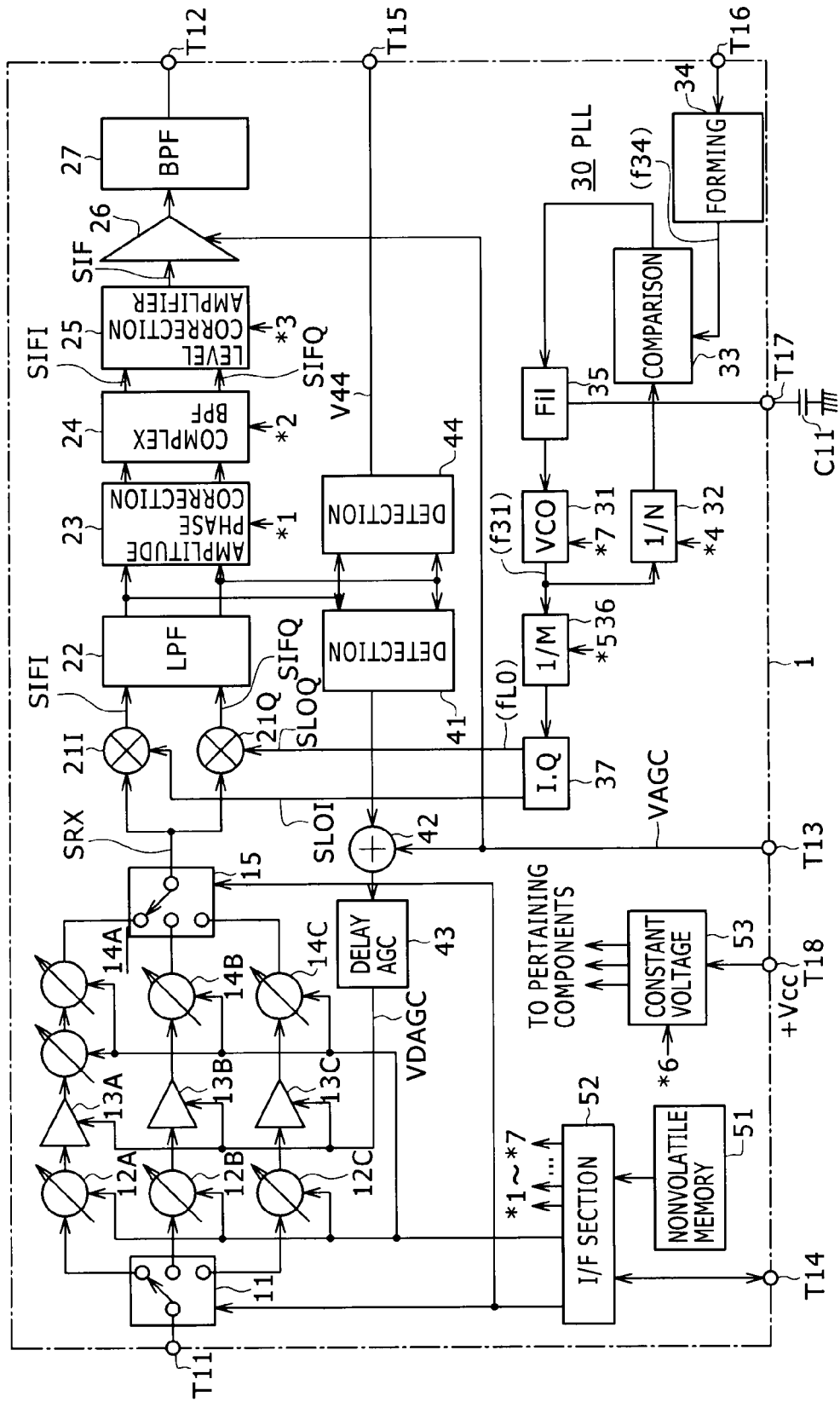

FIG.3
EXAMPLE OF STORAGE CONTENTS
OF NONVOLATILE MEMORY

| | | | | |
|---|---|---|---|---|
| ADJUSTMENT DATA IN SELF IC | TRACKING FILTER ADJUSTMENT DATA | UHF | | |
| | | VHF-H | | |
| | | VHF-L | | |
| | IQ AMPLITUDE ADJUSTMENT DATA | | | ... |
| | IQ PHASE ADJUSTMENT DATA | | | ... |
| | VCO CURRENT ADJUSTMENT DATA | | | ... |
| | CUTOFF FREQUENCY ADJUSTMENT DATA OF IF BPF | BW=6MHz | | |
| | | BW=7MHz | | |
| | | BW=8MHz | | |
| | TUNING FREQUENCY SETTING ADJUSTMENT DATA | | | ... |
| | LEVEL CORRECTION AMPLIFIER ADJUSTMENT DATA | | | ... |
| | REGULATOR VOLTAGE SETTING ADJUSTMENT DATA | | | |
| | ⋮ | | | |
| ADJUSTMENT DATA FOR OTHER THAN SELF IC | GAIN ADJUSTMENT DATA OF IMAGE OUTPUT AMPLIFIER | | | |
| | ⋮ | | | |

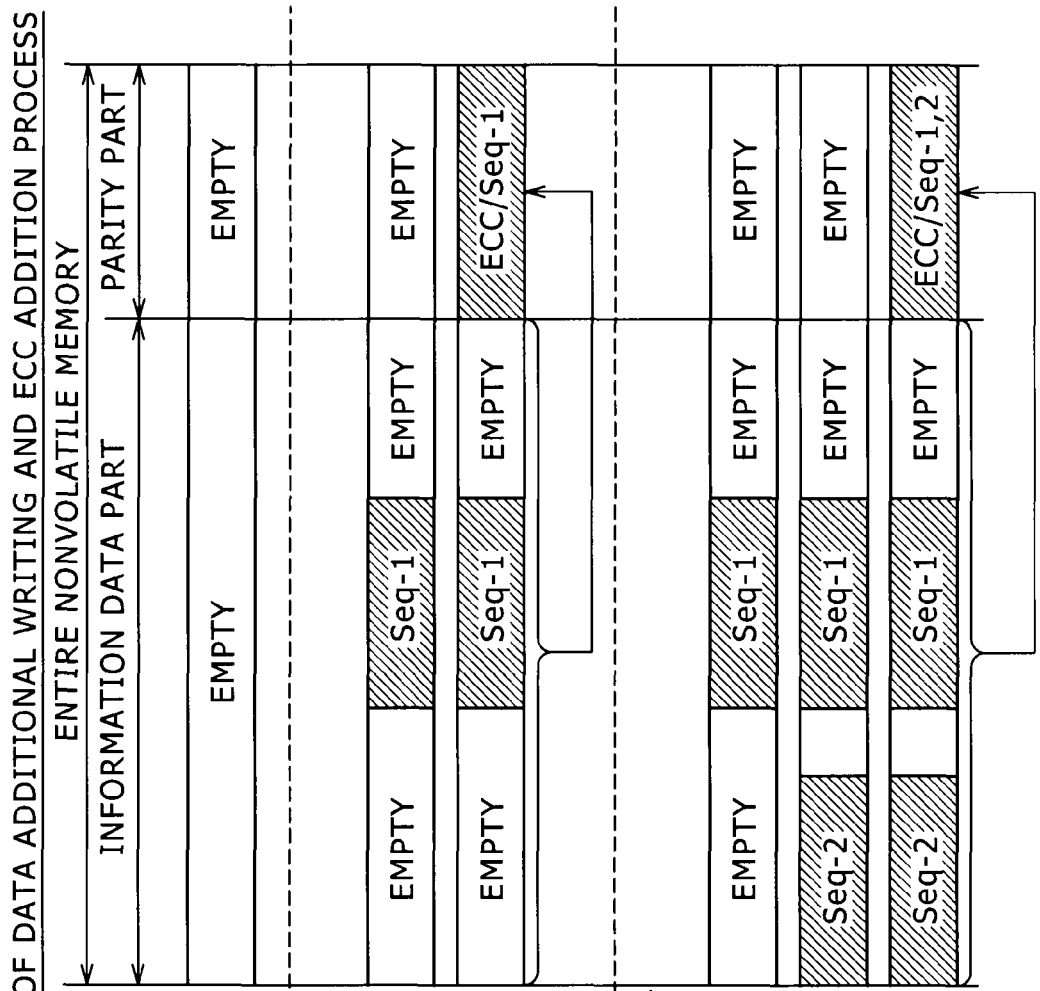

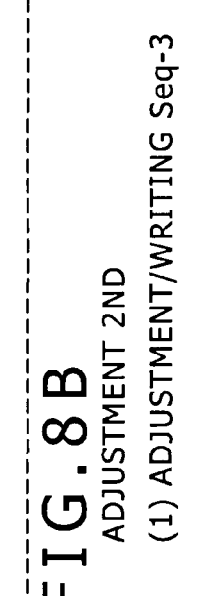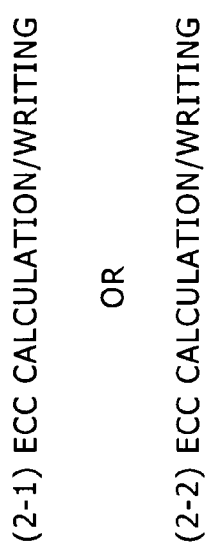
FIG. 8A, FIG. 8B

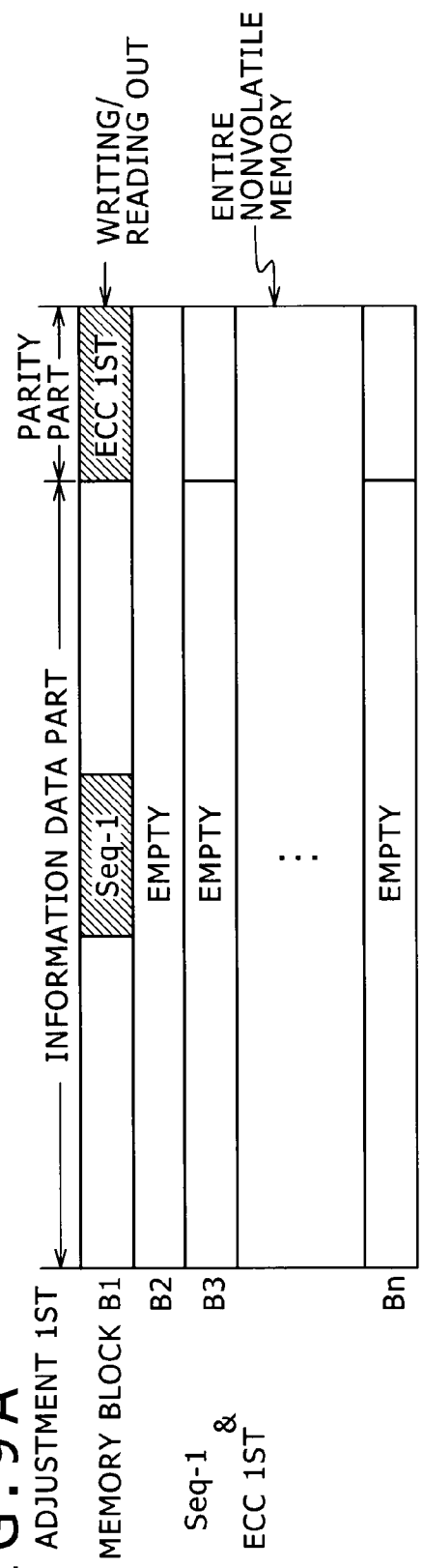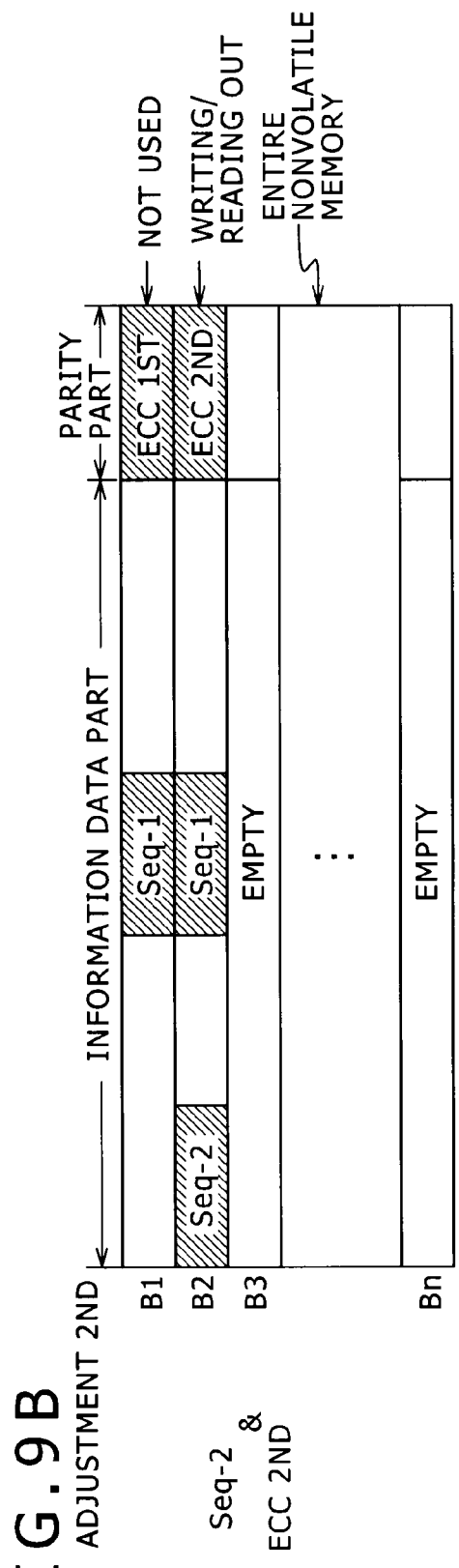

$$\text{IF\_BPF\_COFF} = \frac{\text{IF\_BPF\_COFF2} - \text{IF\_BPF\_COFF1}}{\text{IFBW2} - \text{IFBW1}} \times \text{IFBW}$$

$$+ \frac{\text{IFBW2} \times \text{IF\_BPF\_COFF1} - \text{IFBW1} \times \text{IF\_BPF\_COFF2}}{\text{IFBW2} - \text{IFBW1}}$$

·····(EXPRESSION A)

ELECTRONIC APPARATUS, DISPERSION ADJUSTMENT METHOD OF IC INTERNAL COMPONENT SECTION OF ELECTRONIC APPARATUS AND IC

CROSS REFERENCES TO RELATED APPLICATIONS

The present invention contains subject matter related to Japanese Patent Application JP 2008-093575 filed in the Japan Patent Office on Mar. 31, 2008, the entire contents of which being incorporated herein by reference.

BACKGROUND OF THE INVENTION

1. Field of the Invention

This invention relates to an electronic apparatus such as, for example, a television broadcast receiver, a dispersion adjustment method of an IC (Integrated Circuit) internal component section of an electronic apparatus, and an IC.

2. Description of the Related Art

For example, a front end section of a tuner of a television broadcast receiver requires various kinds of adjustment such as adjustment of the tuning frequency or the gain of a tracking filter of a tuning circuit and adjustment of the image disturbance removal characteristic of a band-pass filter for an image intermediate frequency.

For example, if variable capacitance diodes are incorporated in an IC, generally the characteristic can be made uniform among them. However, since coils cannot be incorporated in an IC, the inductance disperses among them. As a result, a tracking error in the tuning frequency of the tuning circuit is caused by the dispersion of the inductance of the tuning coils.

Although, in related art, adjustment of the tracking error is carried out by manually adjusting an air-core coil, miniaturization is disturbed because the air-core coil has a large size. Further, the adjustment has a drawback that it requires manual operation.

An example of a solution to the problem just described is disclosed, for example, in Japanese Patent Laid-Open No. Hei 11-168399 (hereinafter referred to Patent Document 1). In particular, Patent Document 1 discloses a receiver wherein adjustment data for a tracking error for each reception frequency, that is, adjustment data to be supplied to a variable capacitance diode, are stored in advance in a nonvolatile memory and used to automatically adjust the tracking error.

In particular, in an actual receiver, tuning data to be supplied to a variable capacitance diode is adjusted so that the reception sensitivity of the receiver may have a maximum level for each reception frequency to determine an optimum value. Then, such optimum values are stored as beforehand acquired adjustment data of the tracking error into a nonvolatile memory. Then, for any of the reception frequencies selected by the user, corresponding beforehand acquired adjustment data is read out from the nonvolatile memory to automatically adjust the tracking error.

SUMMARY OF THE INVENTION

Incidentally, a tracking error adjustment operation wherein beforehand acquired adjustment data stored in a nonvolatile memory is used is carried out preferably every time a selected channel is changed by the user. Therefore, in related art, an electronic apparatus is configured such that, every time a selected channel is changed, beforehand acquired adjustment data is read out from a nonvolatile memory to automatically adjust the tracking error.

Therefore, memory accessing to the nonvolatile memory is carried out frequently, and the electronic apparatus has a problem in that it is not preferable in terms of the current consumption and the life of the nonvolatile memory.

Therefore, it is desirable to provide an electronic apparatus which can solve the problem just described.

According to an embodiment of the present invention, there is provided an electronic apparatus including a first integrated circuit including an internal component section capable of being adjusted with adjustment data, a nonvolatile memory in which beforehand acquired adjustment data of a result of adjustment carried out in advance for the internal component section are stored, and an interface section having a data transfer function of transferring the beforehand acquired adjustment data read out from the nonvolatile memory to the outside and a data storage function of storing actual use adjustment data sent thereto from the outside and supplying the stored actual use adjustment data to the internal component section, and a second integrated circuit including a signal processor, to which the interface section of the first integrated circuit is connected, as an internal component section. The signal processor is operable to receive, when the power supply is turned on, the beforehand acquired adjustment data read out from the nonvolatile memory through the interface section, store the received beforehand acquired adjustment data into a built-in memory of the signal processor, read out, while the power supply remains on, the beforehand acquired adjustment data from the built-in memory, produce the actual use adjustment data from the beforehand acquired adjustment data read out from the built-in memory and send the produced actual use adjustment data to the interface section.

In the electronic apparatus, beforehand acquired adjustment data stored in the nonvolatile memory are read out, when the power supply to the electronic apparatus is turned on, by the signal processor and stored into the built-in memory of the signal processor. Then, while the power supply to the electronic apparatus remains on, the signal processor uses the beforehand acquired adjustment data stored in the built-in memory to carry out adjustment of the internal component section of the first integrated circuit.

According to another embodiment of the present invention, there is provided a dispersion adjustment method for an IC internal component section of an electronic apparatus. The method includes the steps of: writing, into a nonvolatile memory of a first integrated circuit which includes an internal component section capable of being adjusted with adjustment data, the nonvolatile memory in which beforehand acquired adjustment data of a result of adjustment carried out in advance for the internal component section are stored, and an interface section having a data transfer function of transferring the beforehand acquired adjustment data read out from the nonvolatile memory to the outside and a data storage function of storing actual use adjustment data sent from the outside and supplying the actual use adjustment data to the internal component section, the adjustment data; by a signal processor of a second integrated circuit which includes, as an internal component section, the signal processor to which the interface section of the first integrated circuit is connected, receiving, when the power supply is turned on, the beforehand acquired adjustment data read out from the nonvolatile memory through the interface section and storing the received beforehand acquired adjustment data into a built-in memory of the signal processor; and by the signal processor, reading out, while the power supply remains on, the beforehand acquired adjustment data from the built-in memory, producing the actual use adjustment data from the beforehand acquired adjustment data read out from the built-in memory and sending the produced actual use adjustment data to the interface section.

According to a further embodiment of the present invention, there is provided an integrated circuit including: an integrated circuit including, as an internal component section, a signal processor to which an interface section of a different integrated circuit, which includes an internal component section capable of being adjusted with adjustment data, a nonvolatile memory in which beforehand acquired adjustment data of a result of adjustment carried out in advance for the internal component section are stored, and an interface section having a data transfer function of transferring the beforehand acquired adjustment data read out from the nonvolatile memory to the outside and a data storage function of storing actual use adjustment data sent from the outside and supplying the stored actual use adjustment data to the internal component section, is connected. The signal processor is operable to receive, when the power supply is turned on, the beforehand acquired adjustment data read out from the nonvolatile memory through the interface section, store the received beforehand acquired adjustment data into a built-in memory of the signal processor, read out, while the power supply remains on, the beforehand acquired adjustment data from the built-in memory, produce the actual use adjustment data from the beforehand acquired adjustment data read out from the built-in memory and send the produced actual use adjustment data to the interface section.

According to yet another embodiment of the present invention, there is provided an electronic apparatus, including: a first integrated circuit including an internal component section capable of being adjusted with adjustment data and a data storage section configured to supply actual use adjustment data sent from the outside to the internal component section; a nonvolatile memory in which beforehand acquired adjustment data of a result of adjustment carried out in advance for the internal component section of the first integrated circuit are stored; and a second integrated circuit including a signal processor, to which the data storage section of the first integrated circuit and the nonvolatile memory are connected, as internal component sections. The signal processor is operable to receive, when the power supply is turned on, the beforehand acquired adjustment data read out from the nonvolatile memory, store the received beforehand acquired adjustment data into a built-in memory of the signal processor, read out, while the power supply remains on, the beforehand acquired adjustment data from the built-in memory, produce the actual use adjustment data from the beforehand acquired adjustment data read out from the built-in memory and send the produced actual use adjustment data to the data storage section.

With the electronic apparatus, reading out of the beforehand acquired adjustment data from the nonvolatile memory may be carried out only when the power supply to the electronic apparatus is turned on. Therefore, the problem of the current consumption and the life of the nonvolatile memory are reduced.

The above and other objects, features and advantages of the present invention will become apparent from the following description and the appended claims, taken in conjunction with the accompanying drawings in which like parts or elements denoted by like reference symbols.

BRIEF DESCRIPTION OF THE DRAWINGS

FIG. 1 is a block diagram showing an outline of an example of a configuration of a television broadcast receiver as a form of an electronic apparatus to which the present invention is applied;

FIG. 2 is a block diagram showing an example of a particular configuration of a front end circuit section of the television broadcast receiver of FIG. 1;

FIG. 3 is a view illustrating an example of adjustment data used in the front end circuit section of FIG. 2;

FIGS. 7A to 7C are diagrammatic views illustrating an example of an error correction encoding process upon writing of adjustment data into the nonvolatile memory shown in FIG. 2;

FIGS. 8A and 8B are diagrammatic views illustrating another example of the error correction encoding process upon writing of adjustment data into the nonvolatile memory shown in FIG. 2;

FIGS. 9A and 9B are diagrammatic views illustrating a further example of the error correction encoding process upon writing of adjustment data into the nonvolatile memory shown in FIG. 2;

DETAILED DESCRIPTION OF THE PREFERRED EMBODIMENTS

Figure 4:
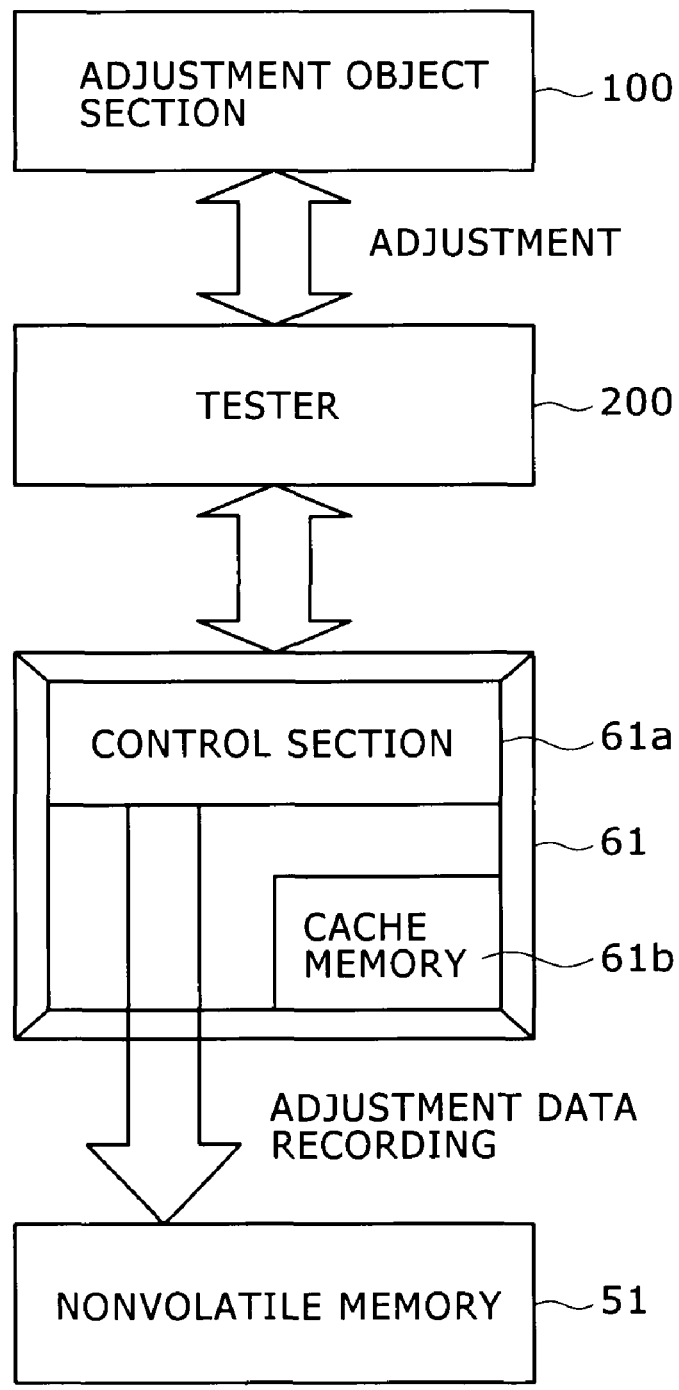
FIG. 4 is a block diagram illustrating writing of adjustment data into a nonvolatile memory of the front end circuit section of FIG. 2.

In the following, electronic apparatus according to preferred embodiments of the present invention are described taking a television broadcast receiver as an example.

FIG. 1 shows an example of a configuration of part of the television broadcast receiver according to the embodiment of the present invention. Referring to FIG. 1, the television broadcast receiver of the present embodiment has a simplified configuration using ICs and includes, as principal components thereof, a front end circuit IC 1, a demodulation circuit IC 2, an image output amplifier 3 and a system controller 4 formed from a microcomputer. The demodulation circuit IC 2 includes a signal processor 61 formed from a microcomputer.

A remote control signal reception section 8 is connected to the system controller 4. The remote control signal reception section 8 receives a remote control signal from a remote control signal sender 9 and transfers the remote control signal to the system controller 4. The system controller 4 analyzes the received remote control signal, decides a user operation such as a power supply on/off operation or a channel switching operation and carries out suitable control in response to a result of the decision.

Television broadcast signals received by a television broadcast signal reception antenna 5 are supplied to the front end circuit IC 1 through a switch circuit 6 and an antenna terminal pin T11. The television broadcast receiver further includes a test signal generation section 7 for generating a test signal for use for calibration of adjustment portions of a front end circuit section 10 hereinafter described. The test signal from the test signal generation section 7 is supplied to the front end circuit IC 1 through the switch circuit 6 and the antenna terminal pin T11.

In the present embodiment, upon adjustment of adjustment portions of the front end circuit section 10 such as upon reception channel switching, the signal processor 61 of the demodulation circuit IC 2 automatically enters a calibration mode, in which it executes such calibration as hereinafter described.

Upon starting of the calibration mode, the signal processor 61 automatically switches the switch circuit 6 to the test signal generation section 7 and causes the test signal generation section 7 to start generation of a test signal. The test signal from the test signal generation section 7 is a signal of a particular single frequency. On the other hand, upon ending of the calibration mode, the signal processor 61 switches the switch circuit 6 back to the television broadcast signal reception antenna 5 side to restore the state wherein television broadcast signals are received.

In the present embodiment, the front end circuit IC 1 includes the front end circuit section 10 as an example of an internal component which can be adjusted with adjustment data, a nonvolatile memory 51 for storing beforehand acquired adjustment data, and an interface (I/F) section 52.

The front end circuit section 10 includes such a plurality of adjustment portions as hereinafter described. Each of the adjustment portions is adjusted in regard to one or a plurality of adjustment items. Adjustment data determined in advance regarding adjustment items of the adjustment portions of the front end circuit section 10 before shipment of the television broadcast receiver from a fabrication factory are stored as beforehand acquired adjustment data in the nonvolatile memory 51. It is to be noted that the present television broadcast receiver is configured such that beforehand acquired adjustment data can be additionally stored into the nonvolatile memory 51 also after the shipment thereof.

The nonvolatile memory 51 is connected to the interface section 52. The interface section 52 is connected to a signal processor 61 in the form of a microcomputer hereinafter described of the demodulation circuit IC 2 through a terminal pin T14 of the front end circuit IC 1.

In this instance, in order to acquire beforehand acquired adjustment data, a tester is used to first adjust the adjustment data regarding the adjustment items of the adjustment portions so that an optimum state may be obtained at a value determined in advance of a parameter which varies, in the present embodiment, the frequency of a channel to be selected. Then, the adjustment data when the optimum state is obtained are stored as the beforehand acquired adjustment data in a corresponding relationship to the corresponding parameter value, that is, the corresponding frequency value, into the nonvolatile memory 51 through the signal processor 61.

It is to be noted that alternatively the tester may write the beforehand acquired adjustment data not through the signal processor 61 but through the interface section 52.

In the present embodiment, as regards the parameter values at which the beforehand acquired adjustment data are stored, the beforehand acquired adjustment data need not be acquired for the frequencies corresponding to all channels to be selected but may be discrete parameter values. As hereinafter described, adjustment data corresponding to a parameter value between the discrete parameter values can be acquired by an interpolation process from the beforehand acquired adjustment data stored in the nonvolatile memory as hereinafter described.

For example, where image disturbance removal of a bandpass filter from an intermediate frequency band is used as an adjustment item, adjustment for image disturbance removal is carried out, for example, at two maximum and minimum VCO frequencies or at further VCO frequencies in the high band or the low band or in the UHF band. Then, the adjustment data at which an optimum state is obtained are stored as beforehand acquired adjustment data in an associated relationship with the frequency parameters into the nonvolatile memory 51.

Then, the beforehand acquired adjustment data are subjected to an error correction encoding process by the signal processor 61 as hereinafter described and stored into the nonvolatile memory 51.

It is to be noted that, where the tester writes the beforehand acquired adjustment data through the interface section 52, an error correction encoding process for the beforehand acquired adjustment data is carried out by the tester.

Some of the beforehand acquired adjustment data stored in the nonvolatile memory 51 which do not vary with respect to a parameter such as the frequency may be supplied as they are as actual adjustment data to some adjustment portions of the front end circuit section 10 if they are subjected to the error correction encoding process.

However, if it is tried to store principal adjustment data, with regard to which the channel frequency is used as a parameter, for all parameter values, then a large number of data must be stored as described hereinabove. Therefore, a smaller number of beforehand acquired adjustment data with regard to only discrete parameter values are stored as described above. Accordingly, in this instance, the beforehand acquired adjustment data are not actual adjustment data which are supplied as they are to the individual adjustment portions of the front end circuit section 10 but are used as basic data by a signal processor in the form of a microcomputer of the demodulation circuit IC 2 hereinafter described when it produces actual adjustment data by an interpolation process.

The beforehand acquired adjustment data stored in the nonvolatile memory 51 are read out in accordance with a reading out request from the signal processor 61 of the demodulation circuit IC 2 received through the interface section 52. The interface section 52 has a function of transferring the beforehand acquired adjustment data read out from the nonvolatile memory 51 in accordance with the reading out request to the signal processor 61.

As hereinafter described, the signal processor 61 produces actual use adjustment data from the beforehand acquired adjustment data read out from the nonvolatile memory 51 and sends the actual used adjustment data to the front end circuit IC 1. The interface section 52 has a function of receiving the actual use adjustment data from the signal processor 61 and storing the actual used adjustment data into a register built therein and then supplying the actual use adjustment data to the individual adjustment portions of the front end circuit section 10.

The front end circuit section 10 converts a received television broadcast signal into an intermediate frequency signal. Then, the front end circuit section 10 signals the intermediate frequency signal to the demodulation circuit IC 2 through a terminal pin T12.

In the present embodiment, the demodulation circuit IC 2 includes the demodulation circuit section 60 for producing an image output signal from the intermediate frequency signal and the signal processor 61 described hereinabove which is a microcomputer. The demodulation circuit IC 2 further includes a detection circuit 62 for detecting a result of calibration in the calibration mode, an AGC voltage generation circuit 63, and an amplifier adjustment voltage generation circuit 64.

To the demodulation circuit section 60, the intermediate frequency signal from the front end circuit IC 1 is supplied through a terminal pin T21. The demodulation circuit section 60 demodulates the inputted intermediate frequency signal to produce an image output signal and supplies the image output signal to the image output amplifier 3 through a terminal pin T22.

The signal processor 61 is connected to the interface section 52 of the front end circuit IC 1 through a terminal pin T23 and connected also to the system controller 4 through a terminal pin T24. It is to be noted that, in the present embodiment, the beforehand acquired adjustment data are sent to the signal processor 61 through the terminal pin T24, and the signal processor 61 carries out a process of writing the beforehand acquired adjustment data into the nonvolatile memory 51 through the interface section 52.

The detection circuit 62 carries out detection of a decision signal for deciding, in the calibration mode or when beforehand acquired adjustment data are to be determined, whether or not the actual use adjustment data supplied to the individual adjustment portions of the front end circuit section 10 are optimum. The detection circuit 62 sends a decision signal representative of a result of the detection to the signal processor 61.

In the calibration mode, the signal processor 61 sends optimum adjustment data values produced in accordance with the decision signal to the interface section 52 so as to be stored into the interface section 52. Then, when the calibration mode ends, the signal processor 61 switches the switch circuit 6 to the television broadcast signal reception antenna 5 side and stops the generation of the test signal from the test signal generation section 7.

The signal processor 61 has a function of carrying out writing/reading out accessing to the nonvolatile memory 51 and a function of error correcting and decoding the beforehand acquired adjustment data acquired from the nonvolatile memory 51 to produce actual use adjustment data. The function of producing actual use adjustment data includes a function of producing actual use adjustment data from beforehand acquired adjustment data by interpolation and a function of executing calibration as described hereinabove to produce optimum actual use adjustment data.

The AGC voltage generation circuit 63 of the demodulation circuit IC 2 produces an AGC voltage for controlling a gain adjustment circuit of the front end circuit section 10 in response to an input signal of the demodulation circuit section 60. In the calibration mode, the gain adjustment circuit of the front end circuit section 10 produces a fixed AGC voltage so that a fixed gain may be obtained. The AGC voltage generation circuit 63 in the present embodiment is formed from a PWM (Pulse Width Modulation) signal generation circuit.

In the calibration mode, the signal processor 61 carries out changeover so that it outputs not the AGC control signal produced by the demodulation circuit section 60 but a control signal for a fixed gain to the AGC voltage generation circuit 63. The AGC voltage generation circuit 63 supplies an AGC voltage, whose pulse width is adjusted with the control signal, to the front end circuit section 10 through a terminal pin T25 and a terminal pin T13. Consequently, AGC control in an intermediate frequency signal is carried out as hereinafter described.

Further, the amplifier adjustment voltage generation circuit 64 generates an amplifier gain adjustment voltage to be supplied to the image output amplifier 3. Also this amplifier adjustment voltage generation circuit 64 in the present embodiment is formed from a PWM signal generation circuit.

The image output signal outputted from the image output amplifier 3 is an analog signal and must be outputted with an accurate level from its character. However, due to existence of a dispersion of the demodulation circuit IC 2 such as a dispersion of a D/A converter in the demodulation circuit IC 2 or a power supply voltage, a dispersion of the image output amplifier 3 and a dispersion for each of resistance elements of the circuitry, the image output signal is not necessarily outputted with an accurate level.

In related art, a variable resistor is connected to the image output amplifier 3 such that the output level of the image output signal may fall within a prescribed range. Therefore, the countermeasure has a problem in the part cost because of use of a variable resistor and another problem in the adjustment cost in that much time is required for the adjustment.

Taking the problems of the countermeasure into consideration, in the present embodiment, the image output amplifier 3 is formed from a variable gain amplifier, and the amplifier adjustment voltage generation circuit 64 formed from a PWM signal generation circuit is provided in the demodulation circuit IC 2 as described above. To the amplifier adjustment voltage generation circuit 64, adjustment data for adjusting the pulse width of the PWM signal to be outputted are supplied from the signal processor 61. The amplifier adjustment voltage generation circuit 64 supplies an amplifier gain adjustment voltage whose pulse width is adjusted with the adjustment data to the image output amplifier 3 through a terminal pin T26. Consequently, the output level of the image output signal from the image output amplifier 3 is controlled so as to fall within the prescribed range.

The adjustment data to be supplied from the signal processor 61 to the amplifier adjustment voltage generation circuit 64 are stored in the nonvolatile memory 51 of the front end circuit IC 1. The signal processor 61 acquires adjustment data for gain adjustment of the image output amplifier 3 from the nonvolatile memory 51 and supplies the adjustment data to the amplifier adjustment voltage generation circuit 64.

The gain adjustment data of the image output amplifier 3 are determined by adjusting the output level of the image output signal of the image output amplifier 3 so as to fall within a prescribed range using a tester before shipment of the television broadcast receiver from a factory. Then, the determined gain adjustment data are written into the nonvolatile memory 51 together with the above-described adjustment data for the front end circuit IC 1 before shipment of the television broadcast receiver from the factory.

In particular, in the present embodiment, not only the adjustment data for the adjustment portions of the front end circuit IC 1 but also the adjustment data for the other circuits are stored into the nonvolatile memory 51 of the front end circuit IC 1. Further, since the demodulation circuit IC 2 includes a signal processor or microcomputer, the signal processor reads out and acquires all of the adjustment data stored in the nonvolatile memory 51. Then, the signal processor 61 applies, if necessary, a predetermined process to the acquired adjustment data and then supplies the adjustment data to the respective object portions.

Accordingly, where adjustment of any other circuit section than the front end circuit IC 1 is required, necessary adjustment data can be written into the nonvolatile memory 51 in addition to the adjustment data for the image output amplifier 3. In this instance, each of the adjustment data is stored in the nonvolatile memory 51 in such a state that it can be identified by the signal processor 61 with what portion the adjustment is associated such as the front end circuit section 10 or the image output amplifier 3.

[Particular Example of the Front End Circuit IC 1]

FIG. 2 shows a particular example of the front end circuit IC 1 in the present embodiment, particularly of the front end circuit section 10.

Various frequencies or channels are used for television broadcasting in different countries, and the NTSC system, the PAL system, the SECAM system and so forth are available as the color television system. Further, also analog broadcasts and digital broadcasts are available.

Therefore, it seems a promising countermeasure to divide the reception signal system for a television broadcast into a front end circuit for receiving a television broadcast and outputting an intermediate frequency signal and a base band processing circuit for processing the output of the front end circuit and outputting a color image signal and a sound signal. The countermeasure deals with the difference in the broadcasting system of a television broadcast.

FIG. 2 shows an example of a front end circuit configured to receive television broadcasts in various countries irrespective of the difference in the broadcasting form. The front end circuit of FIG. 2 divides the frequencies used in television broadcasts in different countries into three bands including (A) 46 to 147 MHz (VHF-L band),
(B) 147 to 401 MHz (VHF-H band), and
(C) 401 to 887 MHz (UHF band)

such that the frequency to be used can be changed in accordance with an object channel in each of the reception bands.

Referring to FIG. 2, a block 1 surrounded by a chain line denotes the front end circuit which is formed as a one-chip IC as described hereinabove.

Broadcasting wave signals of television broadcasts are received by an antenna, and reception signals of the received broadcasting wave signals are selectively supplied to antenna tuning circuits 12A to 12C through a switch circuit 11 past the terminal pin T11. In this instance, the antenna tuning circuits 12A to 12C are ready for the reception bands of (A) to (C) given hereinabove, respectively. Each of the antenna tuning circuits 12A to 12C changes the capacitance of a tuning capacitor to change the tuning frequency so as to be tuned to the reception signal of an object frequency or channel.

The reception signals from the antenna tuning circuits 12A to 12C are supplied to a switch circuit 15 through high frequency amplification circuits 13A to 13C and then through interstage tuning circuits 14A to 14C, respectively. The switch circuit 15 is switched in an interlocking relationship with the switch circuit 11, and accordingly, a reception signal SRX of an object reception band is extracted from the switch circuit 15. Then, the extracted reception signal SRX is supplied to mixer circuits 21I and 21Q.

It is to be noted that, although the interstage tuning circuits 14A to 14C are also formed similarly to the antenna tuning circuits 12A to 12C, the interstage tuning circuit 14A is formed as a demodulation tuning circuit. Further, as hereinafter described, the tuning capacitors of the tuning circuits 12A to 12C and 14A to 14C are built in the front end circuit IC 1, but the tuning coils are provided externally of the front end circuit IC 1.

A VCO (Voltage Controlled Oscillator) 31 forms an oscillation signal of a predetermined frequency. The VCO 31 is used to form a local oscillation signal and forms part of a PLL circuit 30. In particular, the oscillation signal of the VCO 31 is supplied to a variable dividing circuit 32, by which it is divided into a signal of a 1/N (N is a positive integer) frequency. The divided signal is supplied to a phase comparison circuit 33. Further, a clock of a frequency of approximately 1 to 2 MHz is supplied from the outside through a terminal pin T16 to a signal forming circuit 34, by which it is divided into a signal of a predetermined frequency f34. The divided signal is supplied as a reference signal to the phase comparison circuit 33.

Then, a comparison output of the phase comparison circuit 33 is supplied to a loop filter 35, and the loop filter 35 takes out a dc voltage whose level varies in response to the phase difference between the output signal of the variable dividing circuit 32 and an output signal of the signal formation circuit 34. The dc voltage is supplied as a control voltage for the oscillation frequency f31 to the VCO 31. It is to be noted that a smoothing capacitor C11 is externally connected to the loop filter 35 through a terminal pin T17.

Accordingly, the oscillation frequency f31 of the VCO 31 is given by $$f31 = N \cdot f34 \quad \text{(expression 2)}$$

Therefore, the oscillation frequency f31 of the VCO 31 can be changed by the system controller 4 by controlling the dividing ratio N through the signal processor 61. For example, the oscillation frequency f31 is 1.8 to 3.6 GHz in response to the reception band and the reception frequency or reception channel.

Then, the oscillation signal of the VCO 31 is supplied to a variable dividing circuit 36, by which it is divided into a frequency of 1/M (for example, M=2, 4, 8, 16 or 32). Also the dividing ratio M of the variable dividing circuit 36 is controlled through the signal processor 61 by the system controller 4.

Then, the divided signal from the variable dividing circuit 36 is supplied to a dividing circuit 37, by which it is divided into dividing signals SL0I and SL0Q which have a frequency of one half and have phases orthogonal to each other. The dividing signals SL0I and SL0Q are supplied as local oscillation signals to the mixer circuits 21I and 21Q, respectively.

Here, if fL0: frequency of the dividing signals SL0I and SL0Q then $$fL0 = f31/(2M)$$
$$= N \cdot f34/(2M)$$
$$= f34 \cdot N/(2M)$$

Accordingly, by changing the dividing ratios M and N, the local oscillation frequency fL0 can be varied with a predetermined frequency step over a wide range.

Further,

SRX: reception signal to be received
SUD: image disturbance signal and, for the simplification, $$SRX = ERX \cdot \sin \omega RXt$$

ERX: amplitude of the reception signal SRX
$\omega RX = 2\pi fRX$
fRX: center frequency of the reception signal SRX $$SUX = EUD \cdot \sin \omega UDt$$

EUD: amplitude of the image disturbance signal SUD
$\omega UD = 2\pi fUD$
fUD: center frequency of the image disturbance signal SUD Further, the dividing signals SL0I and SL0Q are set as $$SL0I = EL0 \cdot \sin \omega L0t$$

$$SL0Q = EL0 \cdot \cos \omega L0t$$

EL0: amplitude of the dividing signals SL0I and SL0Q
$\omega L0 = 2\pi fL0$

However, in this instance, if $\omega IF = 2\pi fIF$ fIF: intermediate frequency. For example, 4 to 5.5 MHz (varied depending upon the broadcasting system). Then, in the case of the upper heterodyne system, $$fRX = fL0 - fIF$$

$$fUD = fL0 + fIF$$

Accordingly, the mixer circuits 21I and 21Q output the following signals SIFI and SIFQ, respectively. In particular, the signals SIFI and SIFQ of $$SIFI = (SRX + SUD) \times SL0I$$
$$= ERX \cdot \sin \omega RXt \times EL0 \cdot \sin \omega L0t +$$
$$EUD \cdot \sin \omega UDt \times EL0 \cdot \sin \omega L0t$$
$$= \alpha \{\cos(\omega RX - \omega L0)t - \cos(\omega RX + \omega L0)t\} +$$
$$\beta \{\cos(\omega UD - \omega L0)t - \cos(\omega UD + \omega L0)t\}$$

$$SIFQ = (SRX + SUD) \times SL0Q$$
$$= ERX \cdot \sin \omega RXt \times EL0 \cdot \cos \omega L0t +$$
$$EUD \cdot \sin \omega UDt \times EL0 \cdot \cos \omega L0t$$
$$= \alpha \{\sin(\omega RX + \omega L0)t + \sin(\omega RX - \omega L0)t\} +$$
$$\beta \{\sin(\omega UD + \omega L0)t + \sin(\omega UD - \omega L0)t\}$$

-continued $$\alpha = ERX \cdot EL0/2$$
$$\beta = EUD \cdot EL0/2$$

are outputted.

Then, the signals SIFI and SIFQ are supplied to a low-pass filter 22 having a greater bandwidth than the occupation bandwidth, which is, for example, 6 to 8 MHz, of an image intermediate frequency signal and a sound intermediate frequency signal. As a result, the low-pass filter 22 removes signal components of the sum angular frequencies ($\omega RX + \omega L0$) and ($\omega UD + \omega L0$) (and the dividing signals SL0I and SL0Q). Consequently, $$SIFI = \alpha \cdot \cos(\omega RX - \omega L0)t + \beta \cdot \cos(\omega UD - \omega L0)t \quad \text{(expression 4)}$$
$$= \alpha \cdot \cos \omega IFt + \beta \cdot \cos \omega IFt$$

$$SIFQ = \alpha \cdot \sin(\omega RX - \omega L0)t + \beta \cdot \sin(\omega UD - \omega L0)t \quad \text{(expression 5)}$$
$$= -\alpha \cdot \sin \omega IFt + \beta \cdot \sin \omega IFt$$

are extracted from the low-pass filter 22.

Then, the signals SIFI and SIFQ are supplied to a complex band-pass filter 24, which is a polyphase band-pass filter, through an amplitude phase correction circuit 23 hereinafter described. The complex band-pass filter 24 has the following characteristics (a) to (d):

(a) It has a frequency characteristic of a band-pass filter.
(b) It has a phase shift characteristic and shifts the phase of the signal SIFI by a value φ which is an arbitrary value.
(c) It has a phase shift characteristic and shifts the phase of the signal SIFQ by a value (φ−90°) similarly.
(d) It has two band-pass characteristics which have a frequency f0 and another frequency −f0, which are symmetrical with respect to the zero frequency on a frequency axis, as the center frequencies thereof, and one of the two band-pass characteristics can be selected by a relative phase between the input signals.

Accordingly, the complex band-pass filter 24 delays the signal SIFQ by 90° with respect to the signal SIFI from the items (b) and (c) above as given by $$SIFI = \alpha \cdot \cos \omega IFt + \beta \cdot \cos \omega IFt \quad \text{(expression 6)}$$

$$SIFQ = -\alpha \cdot \sin(\omega IFt - 90°) + \beta \cdot \sin(\omega IFt - 90°) \quad \text{(expression 7)}$$
$$= \alpha \cdot \cos IFt - \beta \cdot \cos \omega IFt$$

In short, in the signal SIFI and the signal SIFQ, the signal components α·cos ωIFt have the same phase with each other whereas the signal components β·cos ωIFt have phases opposite to each other.

Then, the signals SIFI and SIFQ are supplied to a level correction amplifier 25, by which they are added to each other. Consequently, such a signal SIF as described below is extracted from the level correction amplifier 25.

In particular, $$SIF = SIFI + SIFQ \quad \text{(expression 8)}$$
$$= 2\alpha \cdot \cos \omega IFt$$
$$= ERX \cdot EL0 \cdot \cos \omega IFt$$

is extracted. The extracted signal SIF is nothing but an intermediate frequency signal when the reception signal SRX is received in accordance with the upper heterodyne system. This intermediate frequency signal SIF does not include the image disturbance signal SUD. It is to be noted that the amplitude phase correction circuit 23 corrects the amplitude and the phase of the signals SIFI and SIFQ so that the (expression 8) may be satisfied sufficiently, that is, the image disturbance signal SUD may be minimized.

Further, at this time, the level correction amplifier 25 corrects the level of the signal SIF so that, even if the level of the signals SIFI and SIFQ differs depending upon the broadcasting system, an AGC characteristic hereinafter described, particularly the start level of AGC, or the like may not vary.

Then, the intermediate frequency signal SIF is outputted to the terminal pin T12 through a variable gain amplifier 26 for AGC and a band-pass filter 27 for dc component cutting and aliasing.

Accordingly, if the dividing ratios M and N are varied, then an object frequency or channel can be selected in accordance with the (expression 3), and if the intermediate frequency signal SIF outputted to the terminal pin T12 is demodulated in accordance with the broadcasting system, then the object broadcast can be enjoyed.

In this manner, with the present front end circuit section 10, the broad frequency range from 46 to 887 MHz can be coped with by a one-chip IC. Further, the front end circuit section 10 can be implemented using a reduced number of parts without deteriorating the characteristic against disturbance over the wide frequency range. Further, the front end circuit section 10 can cope with a difference in the broadcasting system between the analog broadcasting and the digital broadcasting or with a difference in the broadcasting system among different districts in the world.

Further, reception disturbance by harmonics of a clock signal is reduced, and as a result, the reception sensitivity is improved. Furthermore, since all circuit components of the PLL circuit 30 except the capacitor C11 can be formed on a chip, the PLL circuit 30 is tough against disturbance and suffers less likely from disturbance. Further, since only the interstage tuning circuits 14A to 14C are connected to the high frequency amplification circuits 13A to 13C, respectively, the load is light and signal distortion by the high frequency amplification circuits 13A to 13C is low.

[Example of AGC]

An AGC voltage VAGC is formed by an AGC voltage generation circuit 63 of the demodulation circuit IC 2 at the next stage to the front end circuit IC 1 and is supplied as a gain controlling signal to the variable gain amplifier 26 for AGC through a terminal pin T13. Accordingly, ordinary AGC, that is, AGC of the intermediate frequency signal, is carried out with the gain controlling signal.

Further, for example, if the level of the object reception signal SRX is excessively high or a disturbance wave signal of a high level is included in the reception signal SRX, then the ordinary AGC cannot cope with this. Therefore, the signals SIFI and SIFQ outputted from the low-pass filter 22 are supplied to a level detection circuit 41, by which it is detected whether or not the level of the signals SIFI and SIFQ before AGC is carried out by the AGC amplifier 26 exceeds a predetermined value. Then, a detection signal of the level detection circuit 41 and the AGC voltage VAGC of the terminal pin T15 are supplied to an addition circuit 42, and an addition output from the addition circuit 42 is supplied to a delayed AGC voltage formation circuit 43, by which a delayed AGC voltage VDAGC is formed. The delayed AGC voltage VDAGC is supplied as a gain controlling signal to the high frequency amplification circuits 13A to 13C to carry out delay AGC.

Accordingly, since optimum AGC operation can be achieved from D/U of the intensity of a signal to be received and the intensity of many signals not to be received, a desired broadcast from among digital broadcasts, analog broadcasts or digital and analog broadcast can be received favorably.

[Example of the Testing and Adjustment Voltage]

The signals SIFI and SIFQ outputted from the low-pass filter 22 are supplied to a linear detection circuit 44, by which they are detected and smoothed to form a dc voltage V44 which represents the level of the signals SIFI and SIFQ. The dc voltage V44 is outputted to a terminal pin T15.

The dc voltage V44 outputted to the terminal pin T15 is used upon testing or adjustment of the front end circuit IC 1. For example, the dc voltage V44 can be used in order to check the level of the input signal, that is, the reception signal, over a wide frequency range. In particular, different from an output from an intermediate frequency filter of a narrow band, the attenuation characteristic over a wide band along the signal lines from the antenna terminal pin T11 to the mixer circuits 21I and 21Q can be checked directly.

Further, where the antenna tuning circuits 12A to 12C and the interstage tuning circuits 14A to 14C are to be adjusted, if a test signal is applied to the antenna terminal pin T11 and the AGC voltage VAGC to be supplied to the terminal pin T13 is fixed to a predetermined value, then tracking adjustment can be carried out from the variation of the dc voltage V44. Further, adjustment of various functions and measurement of a characteristic of the front end circuit IC 1 can be carried out with digital data, and automatic adjustment and automatic measurement can be carried out.

[Constant Voltage Circuit]

The front end circuit IC 1 in the present embodiment includes a constant voltage circuit 53, to which a power supply voltage +VCC is supplied through a terminal pin T18. The constant voltage circuit 53 makes use of a band gap of the PN junction to form a constant voltage of a predetermined value from the power supply voltage +VCC, and the constant voltage formed in this manner is supplied to the component circuits of the front end circuit IC 1. It is to be noted that an output voltage of the constant voltage circuit 53 can be adjusted finely, and adjustment data therefor are stored in the nonvolatile memory 51. The signal processor 61 acquires the adjustment data for fine adjustment from the nonvolatile memory 51 to produce actual use adjustment data and supplies the actual use adjustment data to the constant voltage circuit 53 through the interface section 52.

Accordingly, the output power supply voltage of the constant voltage circuit 53 is a constant voltage finely adjusted for each front end circuit IC 1. Therefore, even where the component circuits are formed from MOSFETs, the power supply voltage to be supplied to the circuits can be set to a rather high value. Consequently, the performance of the MOSFETs can be extracted in the maximum.

With the configuration of the front end circuit IC 1 shown in FIG. 2, television broadcasts in the frequency band of 46 to 887 MHz as indicated in the items (A) to (C) given hereinabove can be received. At this time, since the center frequency and the pass-band width of the complex band-pass filter 24 are variable, not only ground wave digital television broadcasts and ground wave analog television broadcasts in Japan but also those outside Japan can be coped with.

[Example of Adjustment Data Stored in the Nonvolatile Memory 51]

FIG. 3 illustrates an example of adjustment data stored in the nonvolatile memory 51. As described hereinabove, the nonvolatile memory 51 is configured such that it stores not only adjustment data for adjustment of the adjustment portions in the front end circuit IC 1 itself but also adjustment data for circuit sections other than those of the front end circuit IC 1.

First, the adjustment data for adjustment of the adjustment portions in the front end circuit IC 1 are described.

Tracking filter adjustment data are data for adjusting the filter pass-band of the antenna tuning circuits 12A to 12C and the interstage tuning circuits 14A to 14C. The tracking filter adjustment data absorb a dispersion of the capacitors built in the antenna tuning circuits 12A to 12C and the interstage tuning circuits 14A to 14C and externally connected coils of them. In the present example, the adjustment data are setting information of the maximum frequency of the frequency band of the filters of the antenna tuning circuits 12A to 12C and the interstage tuning circuits 14A to 14C.

IQ amplitude adjustment data and IQ phase adjustment data are adjustment data for adjusting a characteristic of an intermediate frequency filter, particularly an image disturbance removal characteristic. As the adjustment data, adjustment data at a plurality of reception channel frequencies in each of the three reception bands described hereinabove are stored. In other words, adjustment data at a plurality of intermittent reception channel frequencies regarding the reception channel frequency as a varying parameter are stored as the adjustment data.

In the present embodiment, the plural reception channel frequencies at which the adjustment data are stored do not signify all reception channel frequencies in each of the reception bands, but signify intermittent reception channel frequencies at a plurality of reception channel frequency intervals. Adjustment data at those reception channel frequencies at which such adjustment data are not stored in the nonvolatile memory 51 are determined by an interpolation process from the adjustment data of the reception channel frequencies at which the adjustment data are stored in the nonvolatile memory 51. This similarly applies also to the other adjustment data described below.

VCO current adjustment data are adjustment data for absorbing a current dispersion by a dispersion of the internal resistance of the circuit which forms the VCO in order to implement a normally stable performance.

Cutoff frequency adjustment data of IF BPF are adjustment data for setting of a cutoff frequency of the band-pass filter 24 and are used to absorb a dispersion of resistors and capacitors in the band-pass filter 24. The cutoff frequency adjustment data of IF BPF simultaneously function also for changeover of the cutoff frequency of the band-pass filter 24.

The cutoff frequency adjustment data of IF BPF in the example illustrated in FIG. 3 are adjustment data for setting of three different cutoff frequencies of 6 MHz/7 MHz/8 MHz which are bandwidths BW corresponding to the three reception bands described hereinabove.

Tuning frequency setting adjustment data are used to set and adjust the tuning frequency of the antenna tuning circuits 12A to 12C and the interstage tuning circuits 14A to 14C and are stored regarding a plurality of reception channel frequencies.

Level correction amplifier adjustment data are adjustment data for gain adjustment of the level correction amplifier 25 and absorb a dispersion of the resistors built in the level correction amplifier 25.

Regulator voltage setting adjustment data are adjustment data for fine adjustment of the output voltage of the constant voltage circuit 53.

In the present embodiment, as the adjustment data for circuit sections other than those of the front end circuit IC 1 itself, the gain adjustment data for the image output amplifier 3 are stored as described hereinabove. As the gain adjustment data, adjustment data regarding a plurality of reception channel frequencies may be stored as occasion demands.

[Writing of Adjustment Data (Including the Error Correction Encoding Process)]

FIG. 4 illustrates acquisition of adjustment data and a wiring process of the adjustment data into the nonvolatile memory 51.

Referring to FIG. 4, an adjustment object section 100 is an adjustment portion of a tuning circuit, a band-pass filter or an amplifier of the front end circuit section 10 described hereinabove. As described hereinabove, at an adjustment step prior to shipment of the television broadcast signal reception apparatus of the present embodiment from a factory, a tester 200 is used to carry out adjustment of each adjustment portion of the adjustment object section 100. Then, the tester 200 acquires, for each adjustment item, adjustment data when an optimum state is obtained by the adjustment. The adjustment data obtained regarding the adjustment items are beforehand acquired adjustment data. In this instance, as regards any adjustment item with regard to which adjustment data at a plurality of reception channel frequencies are to be obtained, adjustment is carried out with each of the reception channel frequencies, and adjustment data when an optimum state is obtained are acquired for each adjustment item.

Then, the beforehand acquired adjustment data acquired by the tester 200 are written into the nonvolatile memory 51 through the signal processor 61 of the demodulation circuit IC 2. At this time, the beforehand acquired adjustment data are subjected to an error correction encoding process by software of a control section (CPU) 61a of the signal processor 61 and then written into the nonvolatile memory 51.

Figure 5:
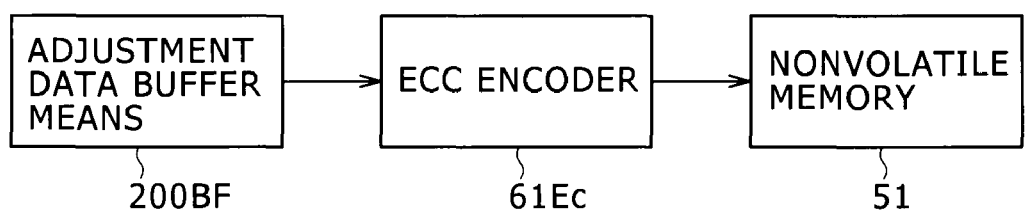
FIG. 5 is a block diagram illustrating processes upon writing of adjustment data into the nonvolatile memory shown in FIG. 2.

In particular, referring to FIG. 5, the beforehand acquired adjustment data stored in adjustment data buffer means 200BF of the tester 200 are supplied to an ECC (Error Correction Code) encoder 61Ec which is provided as a software processing function by the control section 61a of the signal processor 61.

The ECC encoder 61Ec produces a Reed-Solomon (RS) code on the GF ($2^8$) for adjustment data from the adjustment data buffer means 200BF and adds the RS code to the adjustment data. Then, the beforehand acquired adjustment data to which RS codes are added by the ECC encoder 61Ec are written into the nonvolatile memory 51 through the interface section 52 in accordance with a controlling instruction of the signal processor 61.

Figure 6:
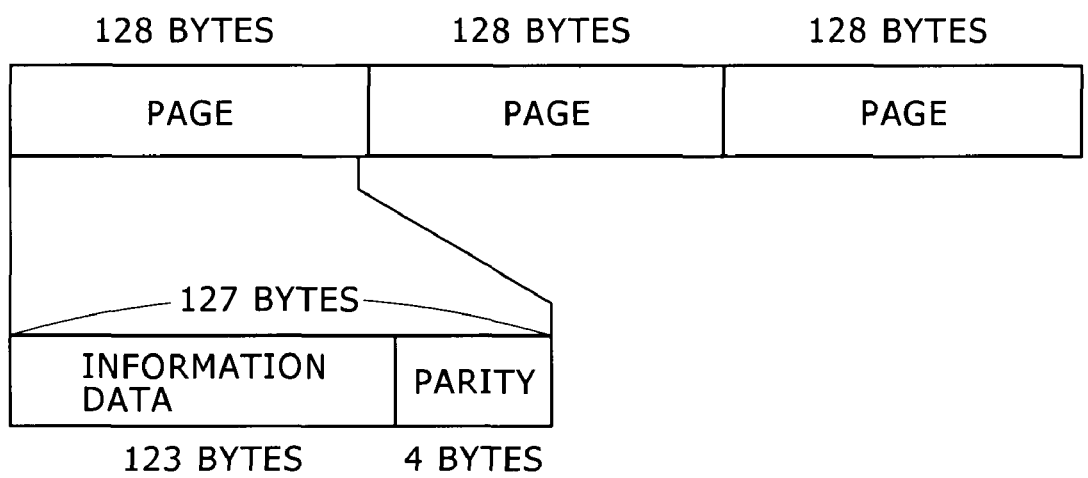
FIG. 6 is a diagrammatic view illustrating a data format of adjustment data written into the nonvolatile memory shown in FIG. 2.

FIG. 6 illustrates a format of an RS code used in the present embodiment. Referring to FIG. 6, the adjustment data is data of three pages of 384 bytes each of which is formed from 128 bytes. An RS code is applied for each 127 bytes of one page. Further, in the present embodiment, a 2-byte correctable RS code is used, and a parity of 4 bytes is produced for and added to adjustment data (information data) of 123 bytes.

It is to be noted that the beforehand acquired adjustment data are recorded in the nonvolatile memory 51 not in such a form that they are divided into pages for each adjustment item, but the beforehand acquired adjustment data regarding all adjustment items are recorded in 3 pages for and to which error correction codes are formed and added.

Thus, the adjustment data for three pages described above are hereinafter referred to as macro data, and the signal processor 61 reads out adjustment data in a unit of macro data from the nonvolatile memory 51. Then, the macro data of the adjustment data are subjected to an error correction decoding process by an error correction decoder provided as a software processing function in the control section 61a of the signal processor 61.

After correctable errors are corrected by the error correction decoding process, the beforehand acquired adjustment data is stored into a cache memory 61b of the signal processor 61. If the adjustment data read out from the nonvolatile memory 51 includes an error which cannot be corrected, then the signal processor 61, for example, retries reading out from the nonvolatile memory 51.

It is to be noted that, while the power supply is on, the signal processor 61 uses the beforehand acquired adjustment data stored in the cache memory 61b to execute an adjustment process for the adjustment portions as hereinafter described.

As described above, in the present embodiment, error correction codes are added to the beforehand acquired adjustment data stored in the nonvolatile memory 51. Accordingly, even if an error occurs upon reading out of stored data from the nonvolatile memory 51, if they are correctable errors, then they are corrected. Consequently, the reliability of the beforehand acquired adjustment data is improved.

Further, in the present embodiment, the error correction decoding process need not be carried out in the front end circuit IC 1 in which the nonvolatile memory 51 is provided, but can be carried out by the signal processor of the demodulation circuit IC 2 which originally includes the signal processor. Accordingly, there is an effect that no signal processer need be provided in the front end circuit IC 1 in which it is difficult to provide a signal processor from a configuration thereof.

In the foregoing description, acquisition of necessary beforehand acquired adjustment data, error correction encoding of the beforehand acquired adjustment data and writing of the encoded beforehand acquired adjustment data into the nonvolatile memory 51 are carried out by a single cycle of processing using the tester 200. However, the acquisition of beforehand acquired adjustment data cannot possibly be carried out by a single cycle of processing, and in this instance, additional recording of adjustment data is required. In the following, a production and addition process of error correction code data where such additional recording of adjustment is required is described.

<First Example of Adjustment Data Additional Writing and an ECC Addition Process>

FIGS. 7A to 7C illustrate a first example of additional writing of adjustment data into the nonvolatile memory 51 and a production and addition process of error correction code data upon such additional writing. Although the error correction code data has a format structure of a unit of a page as described hereinabove with reference to FIG. 6, in FIGS. 7A to 7C, a macro data unit is illustrated in a form wherein it is divided into an information data part (information data storage region) and a parity part (parity storage region) for the convenience of illustration. This similarly applies also to second and third examples hereinafter described.

As seen in FIG. 7A, since the nonvolatile memory 51 immediately after fabrication has nothing written therein, it is in a fully free state. In order to carry out, in this state, a process of using the tester 200 to acquire beforehand acquired adjustment data Seq-1 and writing the beforehand acquired adjustment data Seq-1 into the nonvolatile memory 51, if additional writing of adjustment data is not taken into consideration, then (1) the beforehand acquired adjustment data Seq-1 is written into a free area of the information data part and then (2) error correction code data ECC/Seq-1 is produced with reference to the information data part including the beforehand acquired adjustment data Seq-1 and written into the parity part as seen in FIG. 7B.

However, where it is known that beforehand acquired adjustment data Seq-2 to be additionally written next to the first beforehand acquired adjustment data Seq-1 exists, the method of FIG. 7B cannot be applied. This is because, once error correction code data are written midway, new error correction code data regarding the new data part which includes later additional write data cannot be written.

Therefore, in the present first example, where it is known that beforehand acquired adjustment data Seq-2 to be additionally written next to the first beforehand acquired adjustment data Seq-1 exists, such a process as illustrated in FIG. 7C is executed. In particular, referring to FIG. 7C, (1) first beforehand acquired adjustment data Seq-1 is written into a free area of the information data part, and without carrying out production of error correction code data, (2) next beforehand acquired adjustment data Seq-2 is written into another free area of the information data part. Thereafter, error correction code data ECC/Seq-1 and ECC/Seq-2 are produced based on the information data part including the beforehand acquired adjustment data Seq-1 and Seq-2 and written into the parity part as seen in FIG. 7C.

<Second Example of Adjustment Data Additional Writing and an ECC Addition Process>

FIGS. 8A and 8B illustrate a second example of additional writing of adjustment data into the nonvolatile memory 51 and a production and addition process of error correction code data upon such additional writing. In the second example, even if error correction code data are written midway, new error correction code data regarding the new data part which includes later additional write data can be written.

Referring to FIGS. 8A and 8B, in the present second example illustrated, a number of additional memory regions equal to the number of times by which adjustment data are to be additionally written after error correction code data are written are prepared for the parity part. In the example of FIGS. 8A and 8B, after error correction code data are written, adjustment data are additionally written once. Therefore, the parity part is divided into two portions including a first parity part and a second parity part so that two different error correction code data can be written.

FIG. 8A illustrates a first time writing process sequence of beforehand acquired adjustment data, which is substantially same as that illustrated in FIG. 7C. However, first time error correction code data ECC 1ST (=ECC/Seq 1, 2) is written into the first parity part which is a region for the first time writing of the parity part.

A second time writing process sequence for the next beforehand acquired adjustment data after the first time writing process sequence of the first beforehand acquired adjustment data is such as illustrated in FIG. 8B. In particular, (1) beforehand acquired adjustment data Seq-3 for the second time writing is written into a free region of the information data part.

Then, (2-1) second time error correction code data ECC 2ND (=ECC/Seq-1, 2, 3) are produced based on the information data part including the beforehand acquired adjustment data Seq-1, Seq-2 and Seq-3 and written into the second parity part which is a region for the second time writing of the parity part.

The following procedure (2-2) may be executed in place of the procedure (2-1) described above. In particular, (2-2) second time error correction code data ECC 2ND is produced based on the portion including the information data part including the beforehand acquired adjustment data Seq-1, Seq-2 and Seq-3 and the first time error correction code data ECC 1ST and is written into the second parity part which is a region for the second time writing of the parity part.

According to the method of the second example, the parity part has a capacity sufficient to write therein a number of error correction code data equal to the number of times of adjustment. Therefore, even if error correction code data is produced and added in each cycle of adjustment, adjustment data can be additionally written.

<Third Example of Adjustment Data Additional Writing and an ECC Addition Process>

FIGS. 9A and 9B illustrate a third example of additional writing of adjustment data into the nonvolatile memory 51 and a production and addition process of error correction code data upon such additional writing. Also in the third example, even if error correction code data are written midway, new error correction code data regarding the new data part which includes later additional write data can be written.

In the present third example, the nonvolatile memory 51 has a memory area including n memory blocks B1, B2, ..., Bn each having a storage capacity for one macro block. Then, upon acquisition of beforehand acquired adjustment data and writing of the beforehand acquired adjustment data into the nonvolatile memory 51 in each of first, second, third, ... writing cycles, error correction code data is produced and written.

However, in the present third example, beforehand acquired adjustment data and error correction code data are written into different memory blocks in each writing cycle. Further, the beforehand acquired adjustment data to be read out from the nonvolatile memory 51 and utilized by the signal processor 61 is written in a memory block written in the last writing cycle.

In particular, upon first time writing of beforehand acquired adjustment data, beforehand acquired adjustment data Seq-1 for the first time writing is written into the information data part of the memory block B1, and error correction code data ECC 1ST regarding the information data part including the beforehand acquired adjustment data Seq-1 is written into the parity part of the memory block B1.

Then, upon second time writing of beforehand acquired adjustment data, the beforehand acquired adjustment data Seq-1 for the first time writing is transcribed into the memory block B2 as seen in FIG. 9B. Then, beforehand acquired adjustment data Seq-2 for the second time writing is written into a free area of the same memory block B2. Then, second time error correction code data ECC 2ND is produced based on the information data part including the beforehand acquired adjustment data Seq-1 and Seq-2 and written into the parity part of the memory block B2.

It is to be noted that, also in the present third example, the second time error correction code data ECC 2ND may be produced based not only on the information data part but on the portion additionally including the error correction code data in the preceding operation cycle similarly as in the case of (2-2) of the second example described above.

According to the present third example, even if error correction code data is produced and added in each adjustment cycle, additional writing of adjustment data is permitted similarly as in the second example.

[Adjustment Data Before Factory Shipment and Later Adjustment Data]

The foregoing relates to beforehand acquired adjustment data written into the nonvolatile memory before shipment of the television broadcast receiver from a factory. However, also after factory shipment, for example, an operator may acquire adjustment data in regard to a certain adjustment item and additionally write the beforehand acquired adjustment data into the nonvolatile memory in a use environment of a user.

Figure 10:
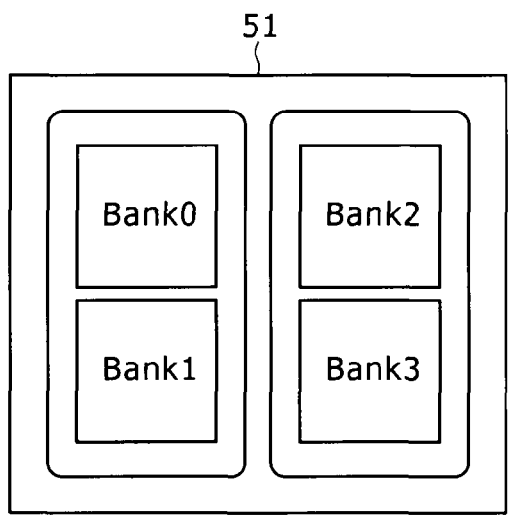
FIG. 10 is a diagrammatic view illustrating a management method of storage contents of the nonvolatile memory shown in FIG. 2.

In the present embodiment, attention is paid also to adjustment data after such factory shipment. In particular, in the present embodiment, the nonvolatile memory 51 includes such a plurality of banks as shown in FIG. 10, particularly in the example of FIG. 10, includes four banks Bank1, Bank2, Bank3, and Bank4.

The bank Bank0 and the bank Bank2 are used as a storage area for beforehand acquired adjustment data before the factory shipment. Meanwhile, the bank Bank1 and the bank Bank3 are used as a storage area for beforehand acquired adjustment data after the factory shipment. Then, the bank Bank0 and the bank Bank1 are used in pair and the bank Bank2 and the bank Bank3 are used in pair as seen in FIG. 10.

Thus, before the factory shipment, the beforehand acquired adjustment data are written into the bank Bank0 from between the banks Bank0 and Bank2 which are the storage area for beforehand acquired adjustment data before the factory shipment.

Meanwhile, writing of beforehand acquired adjustment data is permitted into one of the banks Bank1 and Bank3 which form the storage area for beforehand acquired adjustment data before the factory shipment. If beforehand acquired adjustment data after the factory shipment are stored into the bank Bank1, then since beforehand acquired adjustment data before the factory shipment are written in the bank Bank0, no problem occurs if the beforehand acquired adjustment data are read out from the banks Bank0 and Bank1 paired with each other.

However, if beforehand acquired adjustment data after the factory shipment are stored into the bank Bank3, then in this state, the beforehand acquired adjustment data before the factory shipment are not stored in the bank Bank2. Therefore, if beforehand acquired adjustment data after the factory shipment are stored into the bank Bank3, then the beforehand acquired adjustment data before the factory shipment in the bank Bank0 are copied and stored into the bank Bank2. Then, when the beforehand acquired adjustment data before the factory shipment are stored into the bank Bank2, a write flag FB_2 representing this is set to "0" indicating that the bank Bank2 is in a written state.

Further, in this state, if beforehand acquired adjustment data after the factory shipment are stored into the bank Bank3, then the signal processor 61 refers to the write flag FB_2 of the bank Bank2 to read out the beforehand acquired adjustment data from the banks Bank2 and Bank3 paired with each other.

Figure 11:
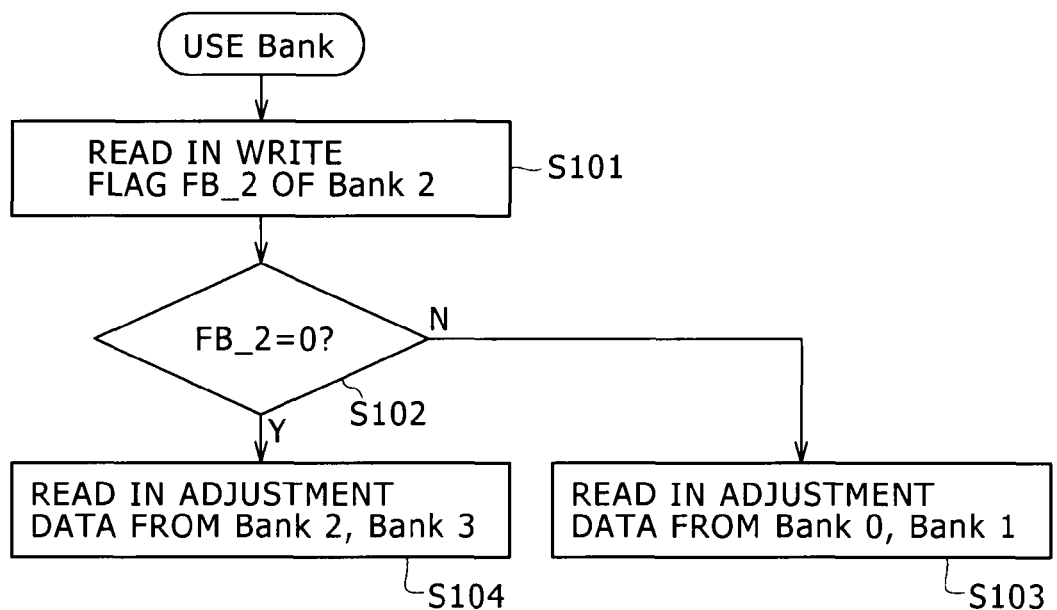
FIG. 11 is a flow chart illustrating a management method of storage contents of the nonvolatile memory shown in FIG. 2.

A use bank determination processing routine by the signal processor 61 in this instance is shown in FIG. 11.

Referring to FIG. 11, the signal processor 61 reads out the write flag FB_2 of the bank Bank2 prior to reading out of beforehand acquired adjustment data from the nonvolatile memory 51 at step S101. Then, the signal processor 61 decides at step S102 whether or not the write flag FB_2 is "0."

If it is decided at step S102 that the write flag FB_2 is not "0," then the signal processor 61 decides to read out beforehand acquired adjustment data from the banks Bank0 and Bank1 paired with each other at step S103.

On the other hand, if it is decided at step S102 that the write flag FB_2 is "0," then the signal processor 61 decides to read out beforehand acquired adjustment data from the banks Bank2 and Bank3 paired with each other at step S104.

By changing the storage area of the nonvolatile memory 51 before and after the factory shipment in this manner, the beforehand acquired adjustment data before and after the factory shipment are written into the nonvolatile memory without any trouble. It is to be noted that also the beforehand acquired adjustment data after the factory shipment are stored in the format with error correction codes described above into the nonvolatile memory 51.

[Adjustment Operation Using Beforehand Acquired Adjustment Data After the Power Supply is Turned On Until the Power Supply is Turned Off]

Adjustment operation using beforehand acquired adjustment data stored in the nonvolatile memory 51 is carried out every time a selected channel is changed on the television broadcast receiver by the user.

In this instance, that the nonvolatile memory 51 is accessed from the signal processor 61 every time the selected channel is changed is not preferable if the current consumption and the life of the nonvolatile memory 51 are taken into consideration.

In the present embodiment, in order to solve this problem, the television broadcast receiver is configured such that reading out accessing to beforehand acquired adjustment data from the nonvolatile memory 51 is carried only once when the power supply is made available, that is, when the power supply is turned on.

Figure 12:
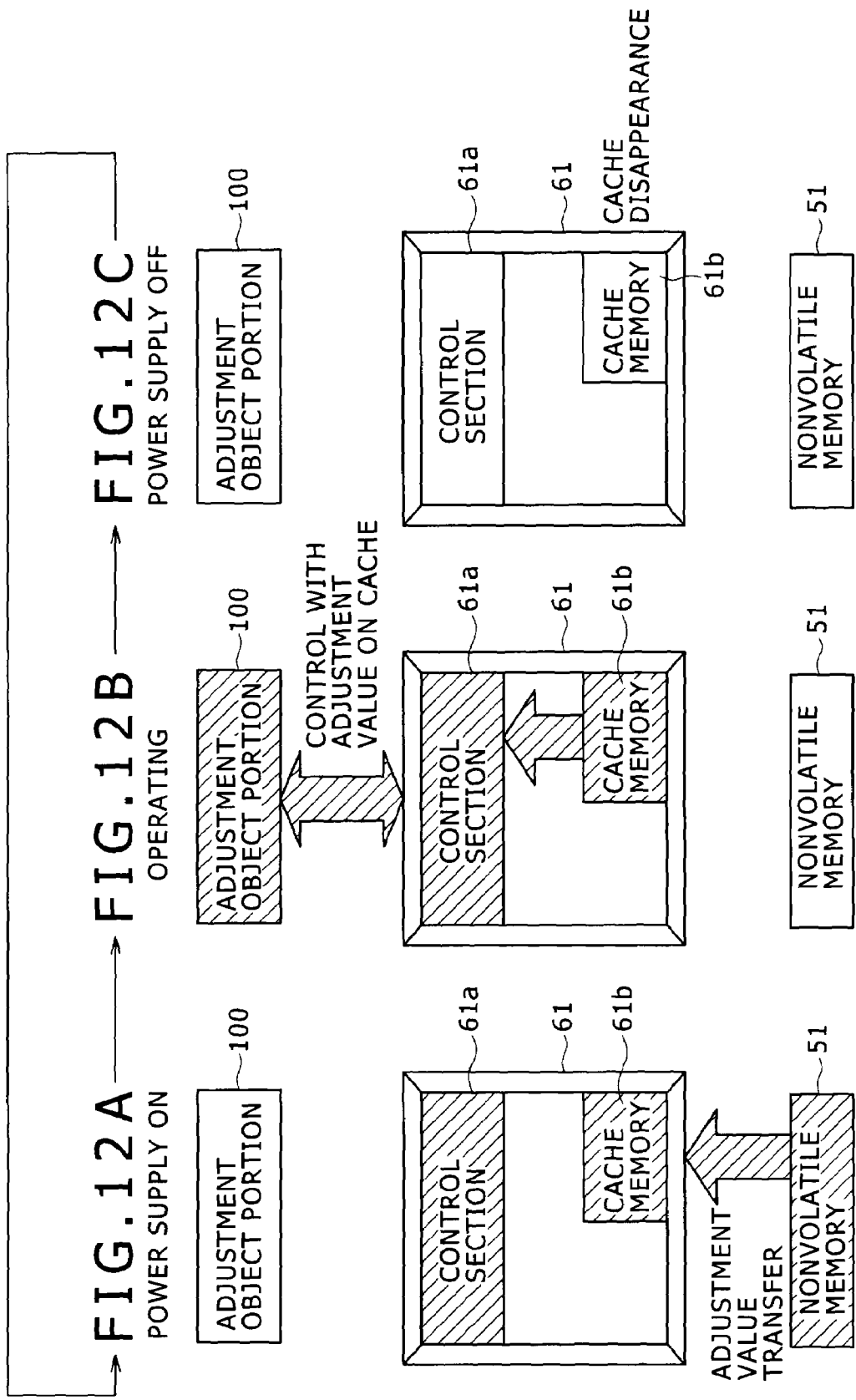
FIGS. 12A to 12C are diagrammatic views illustrating processing operation of the television broadcast receiver of FIG. 1 after the power supply is turned on until the power supply is turned off.

FIGS. 12A to 12C show the configuration just described. In particular, as indicated by half-tone dot meshing in FIG. 12A, when the power supply is made available to the television broadcast receiver, the signal processor 61 sends a transmission request for beforehand acquired adjustment data to the nonvolatile memory 51 to read out beforehand acquired adjustment data from the nonvolatile memory 51. Then, the signal processor 61 stores the beforehand acquired adjustment data acquired from the nonvolatile memory 51 into the cache memory 61b built therein.

During operation of the television broadcast receiver during which the power supply remains on, the control section 61a of the signal processor 61 produces actual use adjustment data using the beforehand acquired adjustment data stored in the cache memory 61b as indicated by half-tone dot meshing in FIG. 12B. Then, the control section 61a of the signal processor 61 supplies the produced actual use adjustment data to an adjustment object portion 100 of the front end circuit section 10. Thereupon, the control section 61a of the signal processor 61 carries out also a process for producing actual use adjustment data by an interpolation process from the beforehand acquired adjustment data stored in the cache memory 61b.

If the power supply to the television broadcast receiver is turned off, then the beforehand acquired adjustment data stored in the cache memory 61b of the signal processor 61 disappear as seen in FIG. 12C. Then, if the power supply is made available to the television broadcast receiver again, then the state of FIG. 12A is re-established. Thus, such a sequence of operations as described above is repeated.

Figure 13:
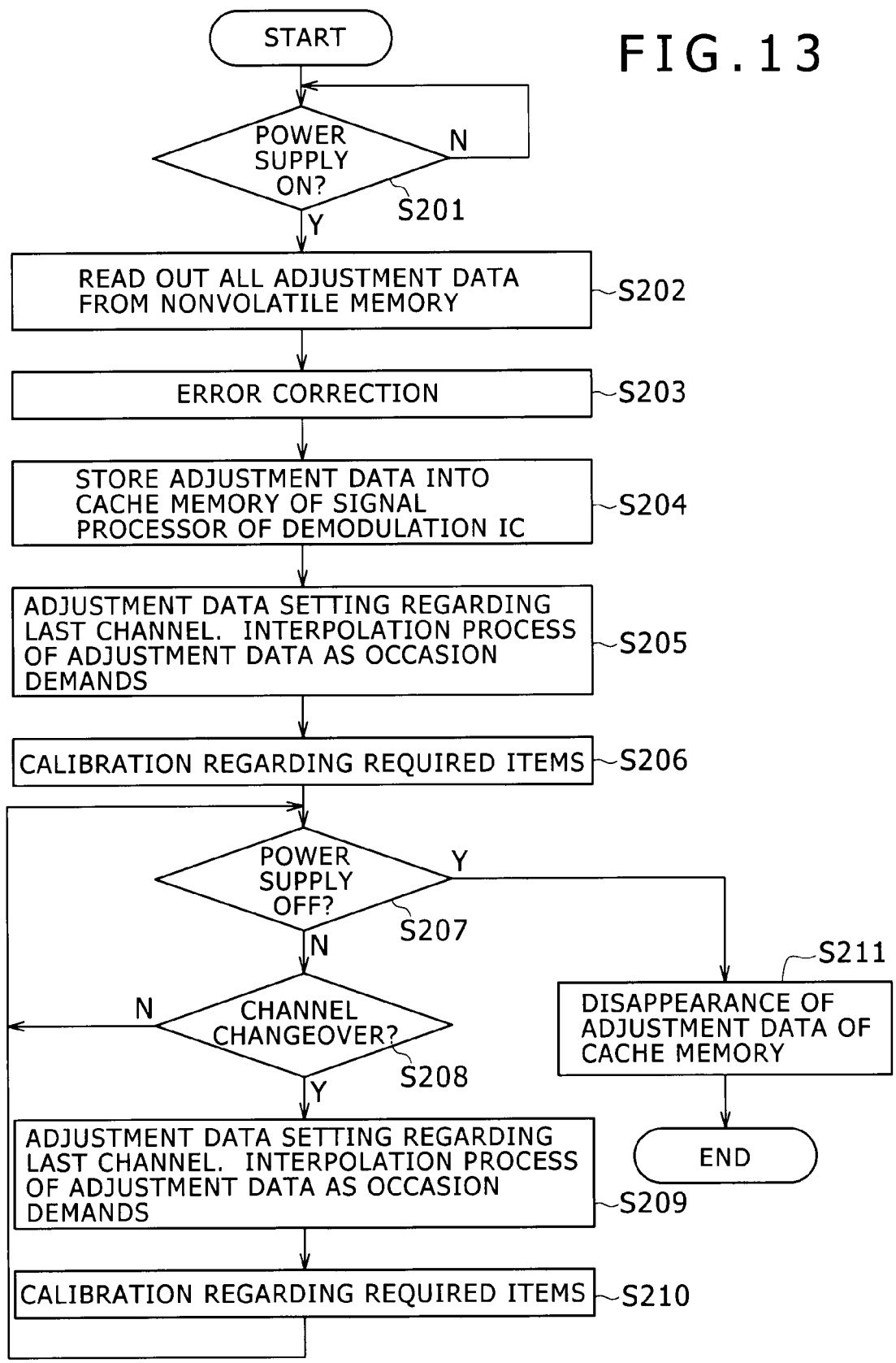
FIG. 13 is a flow chart illustrating processing operation of the television broadcast receiver of FIG. 1 after the power supply is turned on until the power supply is turned off.

FIG. 13 illustrates a flow of processing operation after the power supply to the signal processor 61 is turned on until it is turned off.

The signal processor 61 supervises an instruction from the system controller 4 to decide whether or not the power supply to the television broadcast receiver is turned on at step S201. Then, if it is decided that the power supply is turned on, then the signal processor 61 sends a reading out request for beforehand acquired adjustment data to the nonvolatile memory 51 through the interface section 52 of the front end circuit IC 1 at step S202.

Then, the signal processor 61 acquires the beforehand acquired adjustment data read out from the nonvolatile memory 51 through the interface section 52 and carries out an error correction decoding process for the acquired beforehand acquired adjustment data at step S203. Then, the signal processor 61 stores the beforehand acquired adjustment data whose errors are corrected by error correction into the cache memory 61b built therein at step S204.

Then, the signal processor 61 receives, for example, information of the last channel through the system controller 4 and sends information for selecting the last channel to the front end circuit IC 1. This information includes information of the dividing ratio to be supplied to the dividing circuits 32 and 36 of the PLL circuit 30, and actual use adjustment data for the adjustment portion of the front end circuit section 10 described hereinabove. In particular, the signal processor 61 produces actual use adjustment data regarding the last channel from the beforehand acquired adjustment data stored in the cache memory 61b. The signal processor 61 carries out, upon production of actual use adjustment data, an interpolation process such as linear interpolation in which the beforehand acquired adjustment data are used as occasion demands at step S205.

Then, the signal processor 61 carries out a calibration process regarding necessary adjustment items at step S206. While the calibration process is carried out, the signal processor 61 controls the test signal generation section 7 to an operative state to generate a test signal as described hereinabove and changes over the switch circuit 6 to the test signal generation section 7 side. After the calibration process ends, the signal processor 61 controls the test signal generation section 7 to an inoperative state to stop the generation of the test signal and changes over the switch circuit 6 to the reception antenna 5 side. Consequently, the television broadcast receiver enters a receiving state of the last channel.

Then, the signal processor 61 supervises the information representing that the power supply is turned off from the system controller 4 to decide whether or not a power supply turning off operation is carried out by the user at step S207. Then, if it is decided at step S207 that a power supply turning off operation is not carried out by the user, then the signal processor 61 supervises the information representing that the selected channel is changed over from the system controller 4 to decide whether or not the selected channel is changed over by the user at step S208.

If it is decided at step S208 that the selected channel is not changed over by the user, then the signal processor 61 returns the processing to step S207 to repeat the processes at the steps beginning with step S207.

Then, if it is decided at step S208 that the selected channel is changed over by the user, then the signal processor 61 receives the information of the channel after the channel changeover through the system controller 4 and sends information for selecting the channel after the selected channel changeover to the front end circuit IC 1. This information includes information of the dividing ratio to be supplied to the dividing circuits 32 and 36 of the PLL circuit 30 and the actual use adjustment data for the adjustment portion of the front end circuit section 10. In particular, the signal processor 61 produces actual use adjustment data regarding the channel after the selected channel changeover from the beforehand acquired adjustment data stored in the cache memory 61b. Upon such production of actual use adjustment data, the signal processor 61 carries out an interpolation process such as linear interpolation in which the beforehand acquired adjustment data are used as occasion demands at step S209.

Then, the signal processor 61 carries out a calibration process regarding necessary adjustment items at step S210. While the calibration process is carried out, the signal processor 61 controls the test signal generation section 7 to an operative state to generate a test signal and changes over the switch circuit 6 to the test signal generation section 7 side as described hereinabove.

After the calibration process ends, the signal processor 61 controls the test signal generation section 7 to an inoperative state to stop the generation of the test signal and changes over the switch circuit 6 to the reception antenna 5 side. Accordingly, the television broadcast receiver establishes a reception state of the channel after the selected channel changeover.

Then, the signal processor 61 returns the processing to step S207 to repeat the processes at the steps beginning with step S207.

If it is decided at step S207 that a power supply turning off operation is carried out by the user, then the signal processor 61 ends the processing routine of FIG. 13. At this time, the adjustment data of the cache memory 61b disappear at step S211. It is to be noted that the process at step S211 is not a process executed by the signal processor 61, but indicates for the confirmation that, when the power supply is turned off, the storage contents of the cache memory 61b are lost.

[Example of an Interpolation Process by the Signal Processor 61]

In the present embodiment, the intermediate frequency bandwidth of the band-pass filter 24 for the intermediate frequency can be ready for all broadcasting systems using the "cutoff frequency adjustment data of IF BPF" illustrated in FIG. 3 from within the beforehand acquired adjustment data stored in the cache memory 61b. Further, by carrying out an interpolation process using the "cutoff frequency adjustment data of IF BPF" illustrated in FIG. 3 in response to a desired intermediate frequency bandwidth, it is possible to carry out fine adjustment setting of a cutoff frequency.

Figure 14:
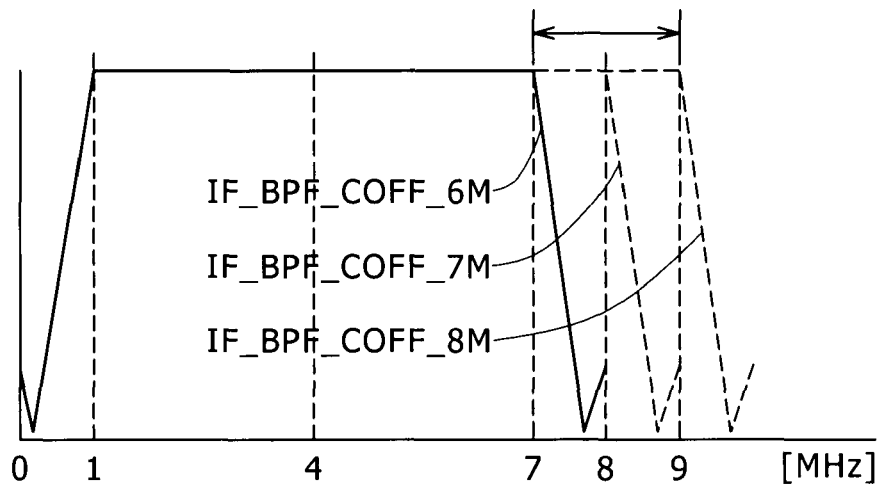
FIG. 14 is a diagram illustrating an example of beforehand acquired adjustment data used in the television broadcast receiver of FIG. 1.

FIG. 14 illustrates the "cutoff frequency adjustment data of IF BPF" stored in the nonvolatile memory 51. Referring to FIG. 14, the minimum frequency of the intermediate frequency bandwidth of the band-pass filter 24 for the intermediate frequency is fixed and is not included in the beforehand acquired adjustment data of the nonvolatile memory 51.

The "cutoff frequency adjustment data of IF BPF" includes beforehand acquired adjustment data IF_BPF_COFF_6M,
IF_BPF_COFF_7M, and
IF_BPF_COFF_8M regarding the cutoff frequencies corresponding to the bandwidths 6 MHz/7 MHz/8 MHz of the three reception bands, respectively.

Figure 15:
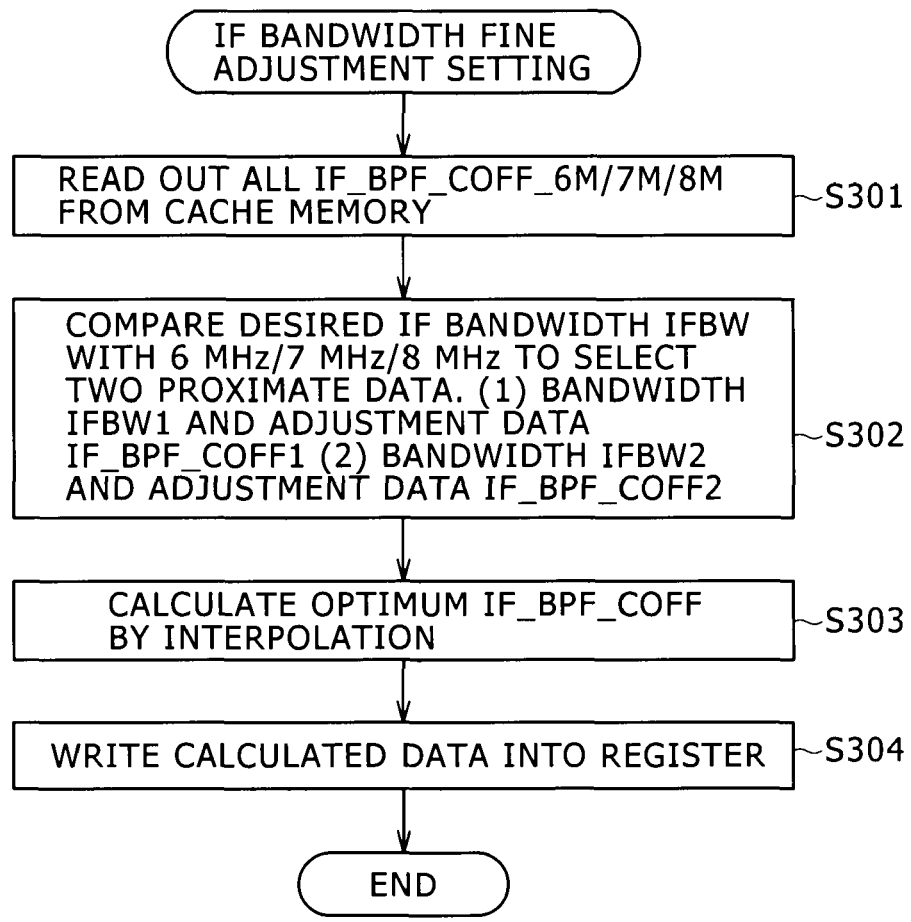
FIG. 15 is a flow chart illustrating an example of a process of producing actual use adjustment data from beforehand acquired adjustment data by the television broadcast receiver of FIG. 1.

The signal processor 61 uses the beforehand acquired adjustment data given above to determine an optimum cutoff frequency corresponding to the selected reception channel for the band-pass filter 24 by an interpolation process. A flow chart of processing operation of the signal processor 61 in this instance is shown in FIG. 15.

The signal processor 61 first reads out the beforehand acquired adjustment data IF_BPF_COFF_6M, IF_BPF_COFF_7M, and IF_BPF_COFF_8M from the cache memory 61b at step S301.

Then, the signal processor 61 compares an optimum desired IF bandwidth IFBW corresponding to the selected reception channel and the bandwidths 6 MHz/7 MHz/8 MHz of the three reception bands with each other to select two data proximate to the desired IF bandwidth IFBW at step S302.

In particular, a first one of the two data which is most proximate to the desired IF bandwidth IFBW is represented by IFBW1, and the bandwidth IFBW1 is selected from among the bandwidths 6 MHz/7 MHz/8 MHz of the three reception bands. Then, the cutoff frequency adjustment data which is the beforehand acquired adjustment data regarding the selected bandwidth is represented as adjustment data IF_BPF_COFF1.

A second one of the two data which is second most proximate to the desired IF bandwidth IFBW is represented as IFBW2, and the bandwidth IFBW2 is selected from among the bandwidths 6 MHz/7 MHz/8 MHz of the three reception bands. Then, the cutoff frequency adjustment data which is beforehand acquired adjustment data regarding the selected bandwidth is represented as adjustment data IF_BPF_COFF2.

Figures 16, 17:
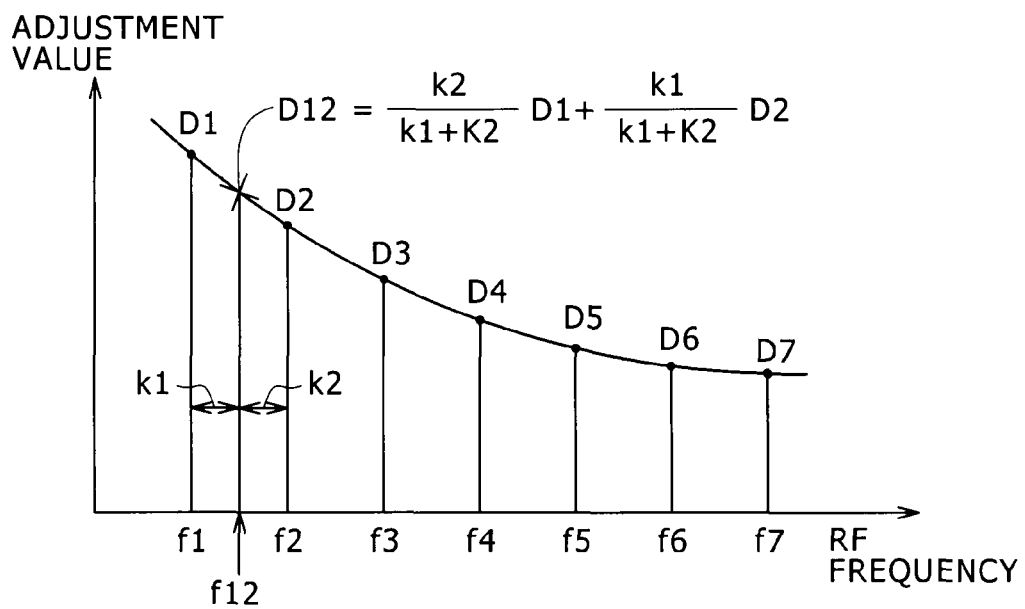
FIG. 16 is a view illustrating an expression which represents the process illustrated in FIG. 15.
FIG. 17 is a diagram illustrating an example of an interpolation process used in production of actual use adjustment data from beforehand acquired adjustment data by the television broadcast receiver of FIG. 1.

Then, the signal processor 61 executes interpolation processing mathematic operation represented by an (expression A) of FIG. 16 using the data selected in such a manner as described above to calculate optimum cutoff frequency adjustment data IF_BPF_COFF at step S303.

Then, the signal processor 61 stores the calculated cutoff frequency adjustment data IF_BPF_COFF into a register at step S304. While the power supply remains on, the cutoff frequency of the band-pass filter 24 is finely adjusted with the cutoff frequency adjustment data IF_BPF_COFF stored in the register.

It is to be noted that the interpolation process for adjustment of the cutoff frequency of the band-pass filter 24 described above is an example of the interpolation process carried out at step S205 of FIG. 13.

Now, an example of the interpolation process carried out at step S208 of FIG. 13 is described. Some of beforehand acquired adjustment data depend upon the variation of the RF frequency corresponding to the selected channel as seen in FIG. 17. Therefore, every time the selected channel changes, actual use adjustment data is produced. Thereupon, however, beforehand acquired adjustment data which directly corresponds to the RF frequency corresponding to the selected channel may not be stored in the nonvolatile memory 51. In FIG. 17, it is illustrated that beforehand acquired adjustment data D1, D2, D3, . . . for intermittent frequencies f1, f2, f3, . . . are stored in the nonvolatile memory 51.

Where beforehand acquired adjustment data which directly corresponds to the RF frequency corresponding to the selected channel is stored in the nonvolatile memory 51 in this manner, the signal processor 61 executes an interpolation process to produce actual use adjustment data.

For example, if the RF frequency corresponding to the selected channel is a frequency f12 between the frequencies f1 and f2 in FIG. 17, then the signal processor 61 executes such an interpolation process as described below. In particular, the signal processor 61 carries out an interpolation process using data D1 and D2 of the frequencies f1 and f2 on the opposite sides of the frequency f12 to calculate actual adjustment data D12 of the frequency f12. Such a mathematic operation expression given below is used for the interpolation process.

In particular, where the difference between the frequency f12 and the frequency f1 is represented by k1 and the difference between the frequency f12 and the frequency f2 is represented by k2, the actual adjustment data D12 is determined by the following mathematic operation expression (B):

$$D12 = \{k2/(k1+k2)\}D1 + \{k1/(k1+k2)\}D2 \qquad \text{(expression B)}$$

[Example of Calibration]

Now, an example of the calibration carried out at step S206 or at step S209 of the flow chart of FIG. 13 is described. The example described below is directed to adjustment of the image disturbance removal characteristic of an intermediate frequency filter, that is, of the band-pass filter 24. The calibration of the image disturbance removal characteristic is hereinafter referred to as IMRR calibration.

For the IMRR calibration of the present example, the demodulation circuit IC 2 includes a detection circuit 62.

<First Example of a Configuration of the Detection Circuit 62 for the IMRR Calibration>

Figure 18:
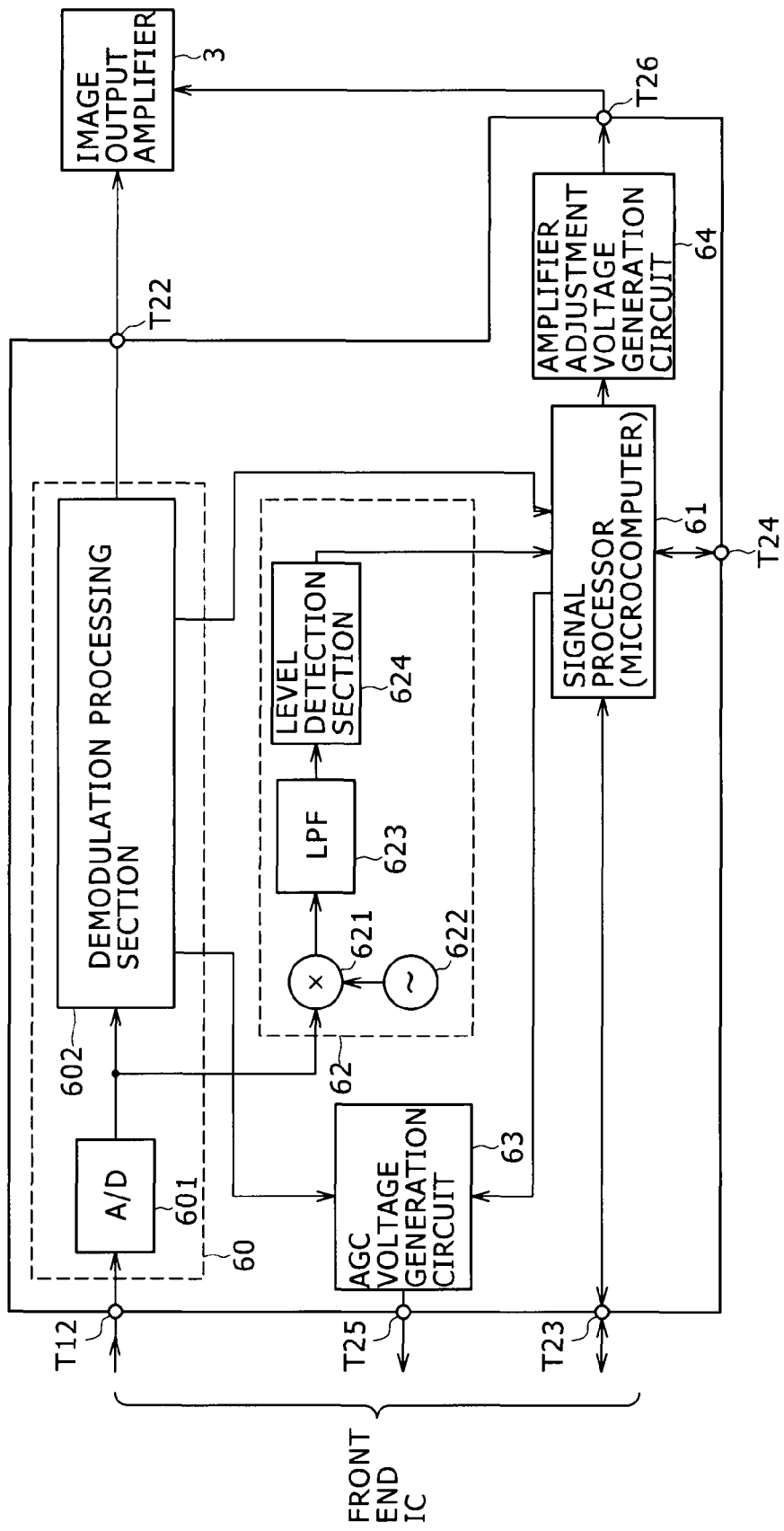
FIG. 18 is a block diagram showing component sections necessary for execution of calibration by the television broadcast receiver of FIG. 1.

A first example of a particular configuration of the detection circuit 62 is shown in FIG. 18. Referring to FIG. 18, in the example shown, the demodulation circuit section 60 includes an A/D converter 601 for converting an intermediate frequency signal from the front end circuit IC 1 into a digital signal, and a demodulation processing section 602. The digital intermediate frequency signal from the A/D converter 601 is supplied to the detection circuit 62.

The detection circuit 62 includes a multiplier 621, an oscillator 622, a low-pass filter 623 and a level detector 624.

The oscillator 622 generates an oscillation signal of an intermediate frequency. A digital intermediate frequency signal is supplied to the multiplier 621, and also the oscillation signal of the oscillator 622 is supplied to the multiplier 621. An output signal corresponding to a frequency of the difference between the digital intermediate frequency signal and the oscillation signal is obtained from the multiplier 621. The output signal of the multiplier 621 is supplied to the level detector 624 through the low-pass filter 623. The level detector 624 detects the level of the output signal of the multiplier 621 and supplies a result of the detection to the signal processor 61.

Although the test signal from the test signal generation section 7 used for the IMRR calibration has a fixed frequency, the frequency is set to an image disturbance frequency to the selected reception channel by the signal processor 61.

Accordingly, when the test signal is inputted from the antenna terminal pin T11 in the IMRR calibration mode, if the image disturbance removal characteristic of the band-pass filter 24 is in an optimum state, then the detection level of the level detector 624 of the detection circuit 62 is ideally equal to zero.

The signal processor 61 refers to the detection level of the level detector 624 of the detection circuit 62 to adjust the adjustment data of the image disturbance removal characteristic of the band-pass filter 24. Then, the signal processor 61 calibrates the adjustment data so that an optimum image disturbance removal characteristic may be obtained.

<Example of Operation upon IMRR Calibration by the Signal Processor 61>

Figure 19:
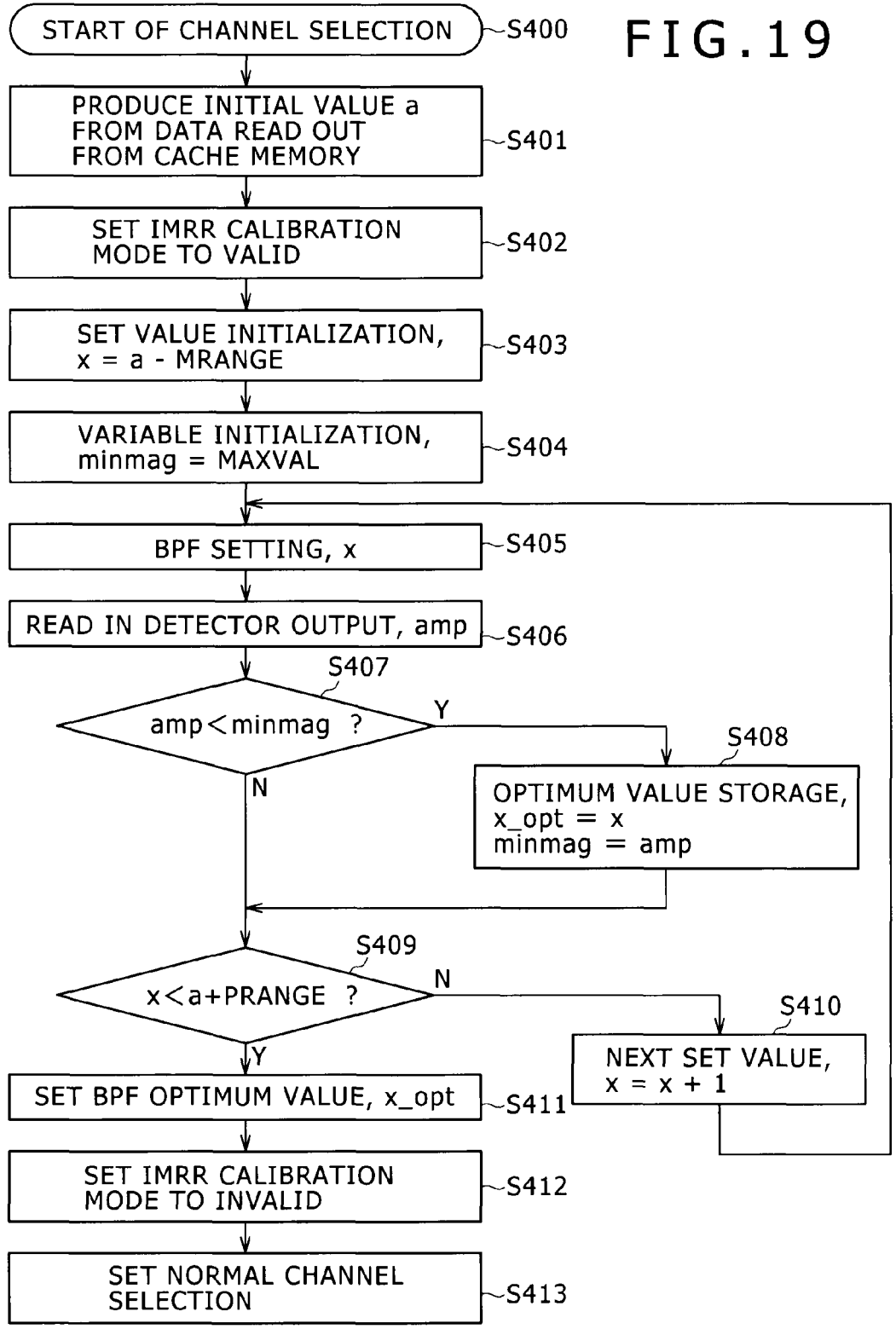
FIG. 19 is a flow chart illustrating a flow of processing operation in calibration by the television broadcast receiver of FIG. 1.

FIG. 19 illustrates a flowchart of processing operation upon calibration of an image disturbance removable characteristic executed by the signal processor 61.

Referring to FIG. 19, the signal processor 61 starts the processing routine for the IMRR calibration at step S400 upon starting of channel selection of the last channel or upon starting of channel selection after selected channel changeover.

Prior to the IMMR calibration, the signal processor 61 first reads out beforehand acquired adjustment data from the cache memory 61b to produce actual use adjustment data and supplies the actual use adjustment data to the front end circuit IC 1 as described hereinabove at step S401. The actual use adjustment data regarding the image disturbance removal characteristic from within the actual use adjustment data produced by the signal processor 61 is determined as a default value a of adjustment data of an object of the IMRR calibration.

The signal processor 61 controls the test signal generation section 7 to generate a test signal for the selected channel and changes over the switch circuit 6 to the test signal generation section 7 side to validate the IMRR calibration mode at step S402.

Then, the signal processor 61 carries out initialization of the adjustment set value for the IMRR calibration at step S403. In particular, the signal processor 61 sets the initial value of the set value x for the IMRR calibration to a minimum value x=a−MRANGE within a range within which the IMRR calibration is carried out.

Then, the signal processor 61 sets a comparatively high value MAXVAL as an initial value to a variable minmag to be compared with the output level of the level detector 624 at step S404. In other words, the signal processor 61 sets the variable minmag to MAXVAL.

Then, the signal processor 61 sends the set value x to the front end circuit IC 1 so that the set value x is set as image disturbance removable characteristic adjustment data of the band-pass filter 24 of the front end circuit section 10 at step S405.

Thereafter, the signal processor 61 reads out the detection level amp of the level detector 624 of the detection circuit 62 at step S406. Then, the signal processor 61 compares the detection level amp of the level detector 624 and the variable minmag with each other to decide whether or not amp<minmag is satisfied at step S407.

If it is decided at step S407 that amp<minmag is satisfied, then the signal processor 61 stores the set value x then as an optimum value x_opt and determines the variable minmag as the detection level amp of the level detector 624 corresponding to the set value x at step S408.

On the other hand, if it is decided at step S407 that amp<minmag is not satisfied, then the signal processor 61 does not carry out updating of the optimum value x_opt and the variable minmag.

Thereafter, the signal processor 61 decides at step S409 whether or not the set value x is higher than a maximum value (a+PRANGE) of the range within which the IMRR calibration is carried out. If it is decided that the set value x is not higher than the maximum value (a+PRANGE), then the signal processor 61 sets the next adjustment value to the set value x at step S410. The next adjustment value is determined in response to the adjustment step width of the IMRR calibration by the signal processor 61. After the next adjustment value is set, the signal processor 61 returns the processing to step S405 to repeat the processes at the steps beginning with step S405.

If it is decided at step S409 that the set value x is higher than the maximum value (a+PRANGE), then the signal processor 61 sets the adjustment value currently held as the optimum value x_opt to an optimum adjustment value regarding the image removal disturbance characteristic at step S411.

Then, the signal processor 61 sets the IMRR calibration mode to invalid and notifies the system controller 4 of this at step S412. Thereafter, the signal processor 61 enters a state for normal operation at the channel being received at step S413.

It is to be noted that, while, in the example of the process of the flow chart of FIG. 19 described above, an optimum adjustment value is determined by a full or exhaustive search method, some other search method such as a binary search method may be used.

<Second Example of a Configuration of the Detection Circuit 62 for the IMRR Calibration>

Figure 20:
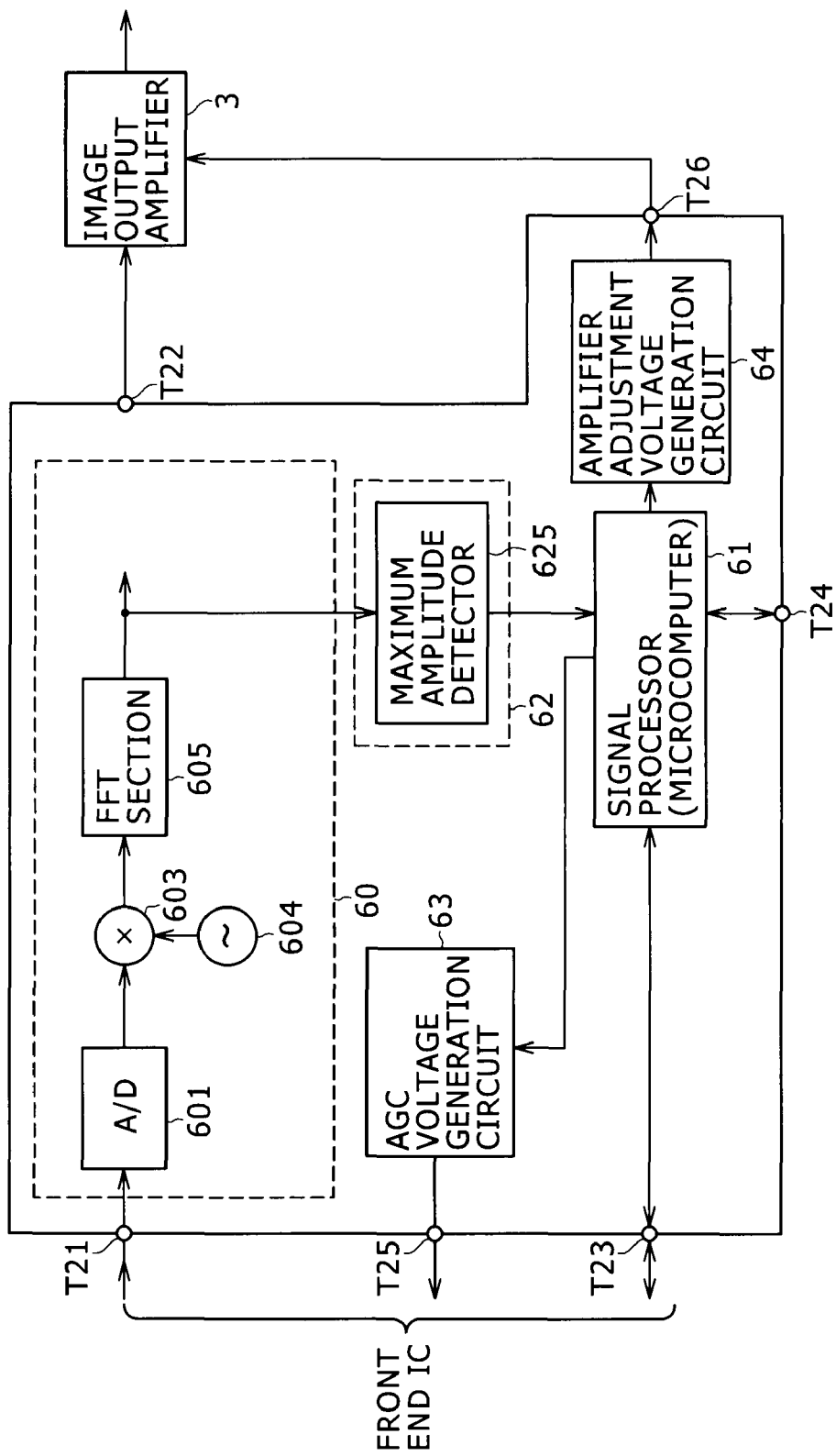
FIG. 20 is a block diagram showing another example of component sections necessary for execution of calibration by the television broadcast receiver of FIG. 1.

FIG. 20 shows a second example of a configuration of the detection circuit 62 of the demodulation circuit IC 2.

The second configuration example makes use of the fact that the demodulation circuit section 60 has a configuration of an OFDM (Orthogonal Frequency Division Multiplexing) demodulation circuit and includes a fast Fourier transform (FFT) section.

In particular, in the demodulation circuit section 60, an output signal of the A/D converter 601 is orthogonally demodulated by a mixer circuit which is formed from a multiplier 603 and a frequency oscillator 604. Then, the signal orthogonally demodulated by the mixer circuit is converted into a signal of a frequency domain by an FFT section 605.

In the present second configuration example, an output signal of the FFT section 605 of the demodulation circuit section 60 is supplied to the detection circuit 62. The detection circuit 62 is formed from a maximum amplitude detector 625. The maximum amplitude detector 625 determines a frequency at which a maximum amplitude is exhibited from a result of the mathematic operation of the FFT section 605 and outputs the amplitude of the frequency. The amplitude output of the maximum amplitude detector 625 is supplied to the signal processor 61.

In the IMRR calibration, since a test signal of an image disturbance frequency is supplied through the antenna terminal pin T11, the maximum amplitude detector 625 supplies an amplitude output in the image disturbance frequency to the signal processor 61.

Accordingly, the signal processor 61 can set an optimum adjustment value of the image disturbance removal characteristic by setting an adjustment value of the image disturbance removal characteristic by the IMRR calibration so that the amplitude output of the maximum amplitude detector 625 may be zero.

By carrying out calibration using beforehand acquired adjustment data stored in advance in the nonvolatile memory 51 in such a manner as described above, accurate actual use adjustment data suitable for a secular change and an environment in use are produced. At this time, since the calibration of the actual use adjustment data is carried out using the beforehand acquired adjustment data stored in the nonvolatile memory 51 as the starting point, the time required for the calibration until optimum actual use adjustment data are obtained is short.

It is to be noted that the test signal generation section 7 for calibration may otherwise be provided in the front end circuit IC 1.

Other Embodiments and Other Modifications

Figure 21:
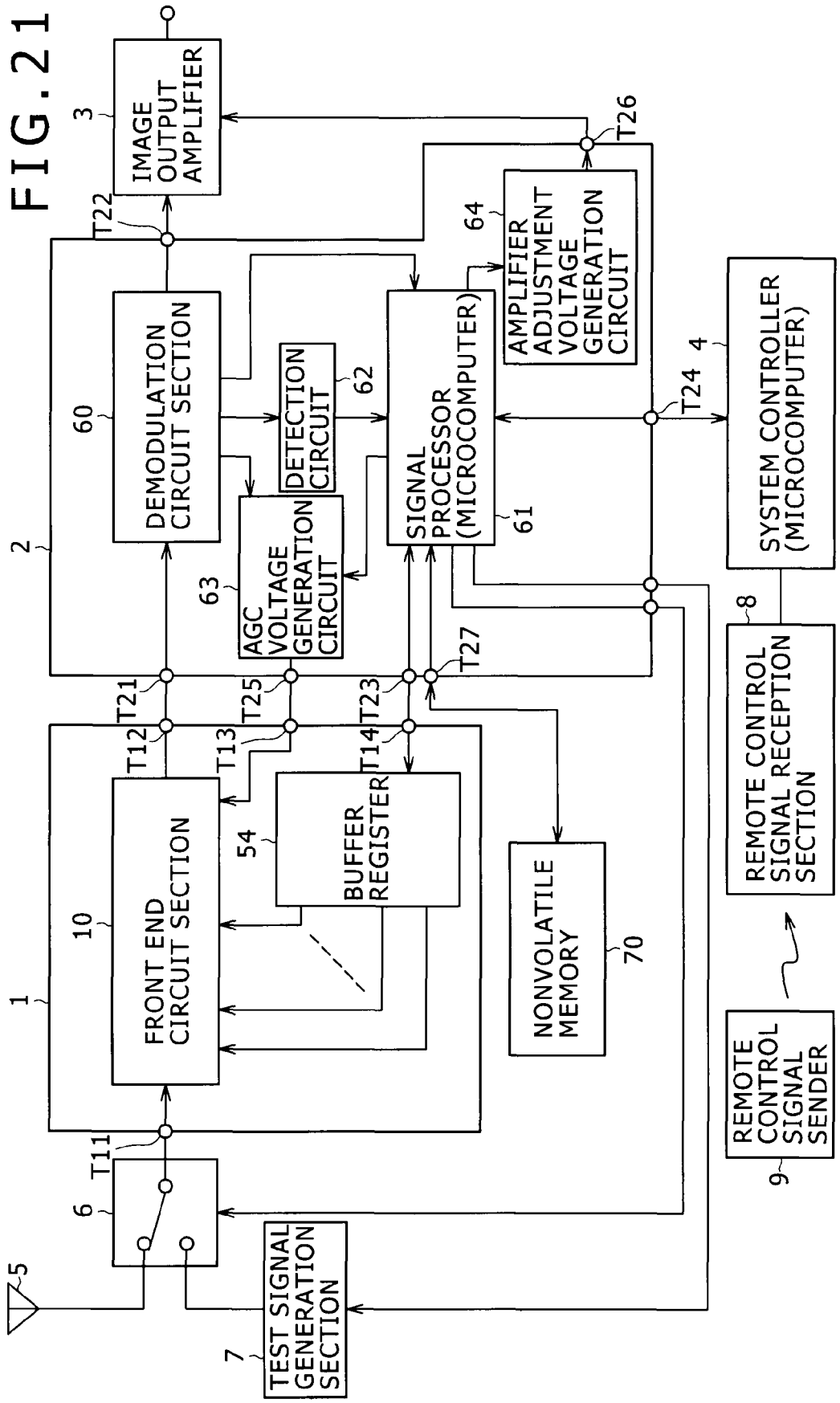
FIG. 21 is a block diagram showing another electronic apparatus to which the present invention is applied.

In the embodiment described above, the nonvolatile memory 51 for storing adjustment data regarding adjustment portions of the front end circuit section 10 is provided in the front end circuit IC 1. However, the nonvolatile memory 51 may otherwise be provided outside the front end circuit IC 1. FIG. 21 shows an example of a configuration of the television broadcast receiver of the configuration just described.

Referring to FIG. 21, the front end circuit IC 1 does not include a nonvolatile memory but only includes a buffer register 54. The buffer register 54 receives and stores adjustment data of the adjustment portions of the front end circuit section 10 from the signal processor 61 of the demodulation circuit IC 2 and supplies the adjustment data to the adjustment portions of the front end circuit section 10.

Further, in the present example, a nonvolatile memory 70 is provided outside the front end circuit IC 1 and is connected to the signal processor 61 through a terminal pin T27. The signal processor 61 accesses, when necessary, the nonvolatile memory 70 to read out beforehand acquired adjustment data from the nonvolatile memory 70. Then, similarly as in the embodiment described hereinabove, the signal processor 61 produces actual use adjustment data from the beforehand acquired adjustment data received from the nonvolatile memory 70 and supplies the actual use adjustment data to the buffer register 54.

The configuration of FIG. 21 operates similarly to the embodiment described hereinabove except that the nonvolatile memory 70 is provided outside the front end circuit IC 1 and achieves similar working effects.

It is to be noted that, while the calibration in the embodiment described above is carried out only for adjustment data regarding the image disturbance removal characteristic of the band-pass filter 24, the calibration is not limited to this. For example, the calibration may be carried out also for tuning frequency adjustment data or gain adjustment data of a tracking filter. Further, the calibration may be applied also to the cutoff frequency adjustment of the band-pass filter 24. Furthermore, the calibration may be carried out also for current dispersion adjustment data of the VCO or dispersion adjustment data regarding the constant voltage power supply from the constant voltage circuit 53.

Further, while, in the foregoing description of the embodiment, the reception channel frequency is taken as an example of a parameter regarding a change of adjustment data, the parameter is not limited to this. For example, it is possible to store adjustment data according to a secular change in the nonvolatile memory and incorporate a timer for measuring the time in the electronic apparatus such that optimum adjustment data at a current point of time is produced by an interpolation process from the adjustment data in response to the elapsed time.

Also it is possible to store adjustment data according to a temperature change in the nonvolatile memory and incorporate means for measuring the ambient temperature in the electronic apparatus such that the temperature at the current point of time is measured by the temperature measuring means and adjustment data suitable for the temperature is produced from the adjustment data stored in the nonvolatile memory by an interpolation process.

Further, while the RS code is used as the error correction code for adjustment data to be written into the nonvolatile memory, naturally it is possible to use not only the RS code but also various other error correction codes or error detection correction codes.

It is to be noted that, while the electronic apparatus in the embodiments described above is a television broadcast receiver, naturally the present invention can be applied to various electronic apparatus in addition to the television broadcast receiver.

While preferred embodiments of the present invention have been described using specific terms, such description is for illustrative purpose only, and it is to be understood that changes and variations may be made without departing from the spirit or scope of the following claims.

What is claimed is:

1. An electronic apparatus, comprising:
    a first integrated circuit including an internal component section capable of being adjusted with adjustment data, a nonvolatile memory in which beforehand acquired adjustment data of a result of adjustment carried out in advance for said internal component section are stored, and an interface section having a data transfer function of transferring the beforehand acquired adjustment data read out from said nonvolatile memory to the outside and a data storage function of storing actual use adjustment data sent from the outside and supplying the stored actual use adjustment data to said internal component section; and a second integrated circuit including a signal processor, to which said interface section of said first integrated circuit is connected, as an internal component section, said signal processor being operable to receive, when the power supply is turned on, the beforehand acquired adjustment data read out from said nonvolatile memory through said interface section, store the received beforehand acquired adjustment data into a built-in memory of said signal processor, read out, while the power supply remains on, the beforehand acquired adjustment data from said built-in memory, produce the actual use adjustment data from the beforehand acquired adjustment data read out from said built-in memory and send the produced actual use adjustment data to said interface section.

2. The electronic apparatus according to claim 1, wherein said first integrated circuit composes a front end section configured to receive a broadcast signal, and said second integrated circuit composes a demodulation section configured to demodulate a signal from said front end section.

3. The electronic apparatus according to claim 1, wherein the beforehand acquired adjustment data are written in an error correction encoded form in said nonvolatile memory and are subjected to error correction decoding by said signal processor of said second integrated circuit.

4. A dispersion adjustment method for an IC internal component section of an electronic apparatus, comprising the steps of:
  writing, into a nonvolatile memory of a first integrated circuit which includes an internal component section capable of being adjusted with adjustment data, the nonvolatile memory in which beforehand acquired adjustment data of a result of adjustment carried out in advance for the internal component section are stored, and an interface section having a data transfer function of transferring the beforehand acquired adjustment data read out from the nonvolatile memory to the outside and a data storage function of storing actual use adjustment data sent from the outside and supplying the actual use adjustment data to the internal component section, the adjustment data;
  by a signal processor of a second integrated circuit which includes, as an internal component section, the signal processor to which the interface section of the first integrated circuit is connected, receiving, when the power supply is turned on, the beforehand acquired adjustment data read out from the nonvolatile memory through the interface section and storing the received beforehand acquired adjustment data into a built-in memory of the signal processor; and
  by the signal processor, reading out, while the power supply remains on, the beforehand acquired adjustment data from the built-in memory, producing the actual use adjustment data from the beforehand acquired adjustment data read out from the built-in memory and sending the produced actual use adjustment data to the interface section.

5. An integrated circuit, comprising:
  an integrated circuit including, as an internal component section, a signal processor to which an interface section of a different integrated circuit, which includes an internal component section capable of being adjusted with adjustment data, a nonvolatile memory in which beforehand acquired adjustment data of a result of adjustment carried out in advance for the internal component section are stored, and an interface section having a data transfer function of transferring the beforehand acquired adjustment data read out from the nonvolatile memory to the outside and a data storage function of storing actual use adjustment data sent from the outside and supplying the stored actual use adjustment data to the internal component section, is connected;
  said signal processor being operable to receive, when the power supply is turned on, the beforehand acquired adjustment data read out from said nonvolatile memory through said interface section, store the received beforehand acquired adjustment data into a built-in memory of said signal processor, read out, while the power supply remains on, the beforehand acquired adjustment data from said built-in memory, produce the actual use adjustment data from the beforehand acquired adjustment data read out from said built-in memory and send the produced actual use adjustment data to said interface section.

6. The integrated circuit according to claim 5, wherein said integrated circuit composes a demodulation section configured to receive a signal from the different integrated circuit which composes a front end section configured to receive a broadcast signal.

7. An electronic apparatus, comprising:
  a first integrated circuit including an internal component section capable of being adjusted with adjustment data and a data storage section configured to supply actual use adjustment data sent from the outside to said internal component section;
  a nonvolatile memory in which beforehand acquired adjustment data of a result of adjustment carried out in advance for said internal component section of said first integrated circuit are stored; and
  a second integrated circuit including a signal processor, to which said data storage section of said first integrated circuit and said nonvolatile memory are connected, as internal component sections, said signal processor being operable to receive, when the power supply is turned on, the beforehand acquired adjustment data read out from said nonvolatile memory, store the received beforehand acquired adjustment data into a built-in memory of said signal processor, read out, while the power supply remains on, the beforehand acquired adjustment data from said built-in memory, produce the actual use adjustment data from the beforehand acquired adjustment data read out from said built-in memory and send the produced actual use adjustment data to said data storage section.

* * * * *